United States Patent [19]
Higuchi

[11] Patent Number: 5,466,971
[45] Date of Patent: Nov. 14, 1995

[54] SEMICONDUCTOR DEVICE HAVING A MULTILAYER INTERCONNECTION LAYER

[75] Inventor: Toshihiko Higuchi, Suwa, Japan

[73] Assignee: Seiko Epson Corporation, Tokyo, Japan

[21] Appl. No.: 332,455

[22] Filed: Oct. 31, 1994

Related U.S. Application Data

[63] Continuation of Ser. No. 86,897, Jul. 7, 1993, abandoned.

[30] Foreign Application Priority Data

Jul. 8, 1992 [JP] Japan .................... 4-181221
Jun. 2, 1993 [JP] Japan .................... 5-156195

[51] Int. Cl.⁶ .................... H01L 23/48; H01L 23/46; H01L 29/54
[52] U.S. Cl. .................... 257/751; 257/754; 257/773; 257/763
[58] Field of Search .................... 257/767, 768, 257/769, 740, 751, 752, 754, 750, 773, 761, 763

[56] References Cited

U.S. PATENT DOCUMENTS

| | | | |
|---|---|---|---|
| 4,800,176 | 1/1989 | Kakumu et al. | 257/750 |
| 4,833,519 | 5/1989 | Kawano et al. | 257/752 |
| 4,898,841 | 2/1990 | Ho | 257/773 |
| 4,931,845 | 6/1990 | Ema | 257/767 |
| 5,138,425 | 8/1992 | Ichikawa | 257/767 |

FOREIGN PATENT DOCUMENTS

| | | | |
|---|---|---|---|
| 58-197876 | 11/1983 | Japan | 257/744 |
| 59-61146 | 4/1984 | Japan | 257/752 |
| 59-61147 | 4/1984 | Japan | 257/752 |
| 60-130825 | 7/1985 | Japan | 257/752 |
| 60-176230 | 9/1985 | Japan | 257/752 |
| 61-97825 | 5/1986 | Japan | 257/752 |
| 61-117829 | 6/1986 | Japan | 257/752 |
| 2-208930 | 8/1990 | Japan | 257/751 |

Primary Examiner—Jerome Jackson
Assistant Examiner—Donald L. Monin, Jr.
Attorney, Agent, or Firm—Oliff & Berridge

[57] ABSTRACT

A semiconductor device comprising: a semiconductor substrate; a plurality of conductive layers in which impuries are doped in a silicon composing the substrate; a wiring layer formed on the substrate via a first insulating layer and made chiefly of the silicon; a second insulating layer covering a surface of the substrate at an area including the conductive layers and the wiring layer; contact holes communicating respectively with the conductive layers and the wiring layer, the contact holes being formed by removing a part of the second insulating layer; and a multilayer interconnection layer electrically connected with the conductive layers and/or the wiring layer via the contact holes. The multilayer interconnection layer including a conductive silicon layer made chiefly of a polycrystalline silicon and contacting the conductive layers and/or the wiring layer, a barrier metal layer contacting the conductive silicon layer, and a metal wiring layer contacting the barrier metal layer. In the very small contact hole portions of the semiconductor device, the wiring region has a small contact resistance with the conductive region, e.g., the conductive layer formed on the substrate and the foundation wires made chiefly of silicon.

12 Claims, 11 Drawing Sheets

SEMICONDUCTOR DEVICE HAVING A MULTILAYER INTERCONNECTION LAYER

This is a Continuation of application Ser. No. 08/086,897 filed Jul. 7, 1993, now abandoned.

BACKGROUND OF THE INVENTION

1. Field of the Invention

This invention relates to a semiconductor device in which a multilayer interconnection layer to be electrically connected with a conductive layer via a contact hole has an improved structure, and also to a method of manufacturing such semiconductor device.

2. Description of the Related Art

In conventional semiconductor devices, as one of the simplest structures for wire portions leading from a conductive layer formed in the semiconductor substrate by diffusion of impurities, a structure in which a metal conductive layer such as aluminum, etc., is coated over the insulating layer after the insulating layer is provided with the contact hole is currently known.

In the manufacturing process for contact holes and leading wires such as of modern LSI, thanks to advances of photolithographic and etching technology, it is possible to form contact holes of about 1 μm diameter in an insulating layer of about 1 μm thickness; the inner wall of the contact hole is coated with a metal layer by sputtering. In this conventional method, however, since the contact hole has a very small open width of less than 1 μm and has a steep side wall, the step and hence uneven portions of the contact hole cannot be covered by wiring metal with an adequate degree of step coverage, thus lowing the reliability of wiring.

In order to solve the problems, a concept of changing the deposition conditions for forming electrodes is disclosed in Japanese Patent Laid-Open Publication No. SHO 61-117829, a concept of forming a refractory metal coating by vapor is disclosed in Japanese Patent Laid-Open Publications Nos. SHO 59-61146 and 59-61147, and a concept of filling up the contact hole with refractory metal is disclosed in Japanese Patent Laid-Open Publications Nos. SHO 60-130825, 60-176230 and 61-97825.

In any of the foregoing prior art technologies, after contact holes have been formed in an insulating layer lying over the conductive layer in the form of an impurity diffusion layer formed on a semiconductor substrate, a metal coating is provided thereover. Therefore, the conductive layer having the semiconductor nature and the wiring metal are in direct contact with each other. As a result, even though the reliability of wiring could be improved by filling up the contact hole with the refractory metal having a high conductivity, the contact resistance between the wiring metal material and the semiconductor conductive layer would increase along with the downsizing of contact hole. This is true because of a resistance and a Shottky barrier in the contact portion between the semiconductor and metal due to the difference in energy level, so that the increase of resistance would become more remarkable as the semiconductor-metal contact area become smaller. Because the impurity diffusion layer must be made thinner along with the downsizing of the semiconductor device, it is necessary to reduce the impurity concentration of the impurity diffusion layer and also to lower the temperature for heat treatment. It is therefore difficult to reduce the contact resistance between the semiconductor conductive layer and wiring metal at the contact hole portion.

According to the prior art technology, since the contact resistance between the metal wiring layer of the contact hole portion and the conductive layer of the semiconductor substrate, or the foundation wiring layer chiefly of silicon, would increase sharply as the size of the contact hole is to be very small, the working ability of the semiconductor device would be impaired, fixing a limit on the improvement of performance of the semiconductor device. Yet, if the diameter of the contact hole is large, as compared to the design rule for the remaining portions, in an effort to increase the contact resistance of the contact hole portion using the conventional technology, it goes against downsizing the semiconductor device.

For example, according to the technology disclosed in Japanese Patent Laid-Open Publication No. SHO 60-130825, adequate step coverage is secured by providing the side wall of the contact hole with a slant by isotropic etching using a hydrofluoric acid solution or the like while etching the insulating layer. However, by isotropic etching, the diameter of the upper part of the contact hole would increase so that downsizing of the semiconductor device is difficult to achieve.

SUMMARY OF THE INVENTION

It is therefore an object of this invention to provide a semiconductor device in which at very small contact hole portions, a wiring region has a small contact resistance with a conductive region, such as a conductive layer formed in a semiconductor substrate and a foundation wiring layer chiefly of silicon.

Another object of the invention is to provide a method of manufacturing such a semiconductor device.

According to a first aspect of the invention, there is provided a semiconductor device comprising:
(a) a semiconductor substrate;
(b) a conductive region made chiefly of a semiconductor substance;
(c) an insulating layer covering the surface of the semiconductor substrate at an area including the conductive region;
(d) the insulating layer having a contact hole communicating with the conductive region, the contact hole being formed by removing a part of the insulating layer; and
(e) a multilayer interconnection layer electrically connected with the conductive region via the contact hole, the multilayer interconnection layer being composed of a conductive silicon layer chiefly made of polycrystalline silicon and contacting the conductive region, a barrier metal layer contacting the conductive silicon layer, and a metal wiring layer contacting the barrier metal layer.

The conductive region is a conductive layer in which impurities are doped in a single crystal silicon composing the semiconductor substrate, or a wiring layer formed on the semiconductor substrate via the insulating layer and made chiefly of silicon. The semiconductor device may be applied to a structure in which the conductive region is composed of a plurality of the conductive layers, a structure in which the conductive layer and the wiring layer are combined together, or a structure the conductive layer made chiefly of a semiconductor substance and the metal wiring layer are interconnected with each other via the contact holes.

According to a second aspect of the invention, there is provided a method of manufacturing a semiconductor device, comprising the steps of:
(a) forming a plurality of conductive layers in the form of impurity diffusion layers in which impurities are doped in a semiconductor substrate;

(b) forming a first insulating layer on a surface of the semiconductor substrate;
(c) forming on the first insulating layer a wiring layer made chiefly of silicon;
(d) forming a second insulating layer covering a surface of the substrate at an area including the conductive layers and the wiring layer;
(e) forming contact holes, which communicate respectively with the conductive layers and the wiring layer, by removing part of the second insulating layer;
(f) forming a conductive silicon layer, which is made chiefly of polycrystalline silicon, on the second insulating layer including the contact holes;
(g) forming a barrier metal layer on the conductive silicon layer;
(h) forming a metal wiring layer on the barrier metal layer; and
(i) forming a multilayer interconnection layer in a predetermined pattern by etching the conductive silicon layer, the barrier metal layer and the metal wiring layer.

According to a third aspect of the invention, there is provided a method of manufacturing a semiconductor device, comprising the steps of:
(a) forming a plurality of conductive layers in the form of impurity diffusion layers in which impurities of n-type and p-type are doped in a semiconductor substrate at different regions;
(b) forming an element isolation insulating layer on a surface of the semiconductor substrate;
(c) forming an insulating layer covering the surface of the semiconductor at an area including the conductive layers;
(d) forming a plurality of contact holes, which communicate respectively with the conductive layers, by removing part of the insulating layer;
(e) forming a conductive silicon layer, which is made chiefly of polycrystalline silicon, on the insulating layer including the contact holes;
(f) forming a barrier metal layer on the conductive silicon layer;
(g) forming a metal wiring layer on the barrier metal layer; and
(h) forming a multilayer interconnection layer in a predetermined pattern by etching the conductive silicon layer, the barrier metal layer and the metal wiring layer.

In the semiconductor device of this invention, the wiring layer to be connected with the conductive region, which is made chiefly of a semiconductor substance, via the contact hole is of a multilayer structure composed of a conductive silicon layer and a metal wiring layer. As a result, the conductive silicon layer is interposed between the semiconductor conductive region and the metal wiring layer and therefore it is possible to minimize the resistance and the Shottky barrier due to the difference of energy level as the semiconductor and metal directly contact each other. Also since the conductive silicon layer and metal wiring layer are in contact with each other through their substantially entire surfaces, an adequate contact area can be secured, thus sufficiently reducing the contact resistance between the two layers. According to this invention, partly since the impurity concentration is low and partly since the depth of connection of the impurity diffusion layer is small, small-resistance connection can be realized even in a miniaturized semiconductor device in which the size of contact holes is small. Contact holes have rectangular or more particulary square horizontal cross sections. In the specification of the present invention, a term "diameter" referring to the contact holes means diameter of an inscribed circle of the horizontal cross sections.

Specifically, the conductive region made chiefly of the semiconductor substance is a conductive layer in the form of an impurity diffusion layer in which n-type or p-type impurities are doped in the semiconductor substrate, or a silicon wiring layer formed on the semiconductor substrate via the insulating layer. Since the conductive region made chiefly of the semiconductor substance is contact with the conductive silicon layer made of the same semiconductor substance, it is possible to restrict the parasitic resistance, which impairs the ability of an active element formed on the semiconductor substrate surface, of the contact portion so that the semiconductor device can be operated at high speed.

Though the thickness of the conductive silicon layer depends on the diameter of the contact hole, the conductive silicon layer must have such a thickness that the contact resistance is not too great; preferably 3 to 500 nm and more preferably 10 to 200 nm. The impurity concentration of the conductive silicon layer is preferably $1\times10^{17}$ to $1\times10^{22}$ atoms $cm^{-3}$ and more preferably $1\times10^{19}$ to $1\times10^{21}$ atoms $cm^{-3}$. Having satisfied these conditions, it is possible to adequately reduce the electrical resistance of the wiring layer.

Preferably, the recess defined by the contact hole inside the conductive silicon layer or the barrier metal layer is filled with an insulating substance such as polycrystalline silicon or a metal to make the surface of the contact hole flat. By forming the conductive silicon layer so as to fill the entire contact hole, it is also possible to make the contact hole portion flat. When the contact hole portion is made flat to minimize the number of steps, it is possible to facilitate forming of a wiring layer and a passivation layer.

The multilayer interconnection layer can be applied to a structure having contact holes. For example, the multilayer interconnection layer can be applied to a MOS device, a source/drain electrode or gate electrode of a CMOS device, a leading wire leading from, for example, a TFT and a high-resistance load, and a leading wire leading from each electrode of a bipolar device.

According to the manufacturing method of this invention, it is possible to manufacture a semiconductor device in a simple process. Particularly, the conductive silicon layer is manufactured preferably by chemical vapor deposition. By chemical vapor deposition, it is possible to form a uniform conductive silicon layer even in an elongated recess, the aspect ratio of which is large.

DETAILED DESCRIPTION

First Embodiment

Figure 1:
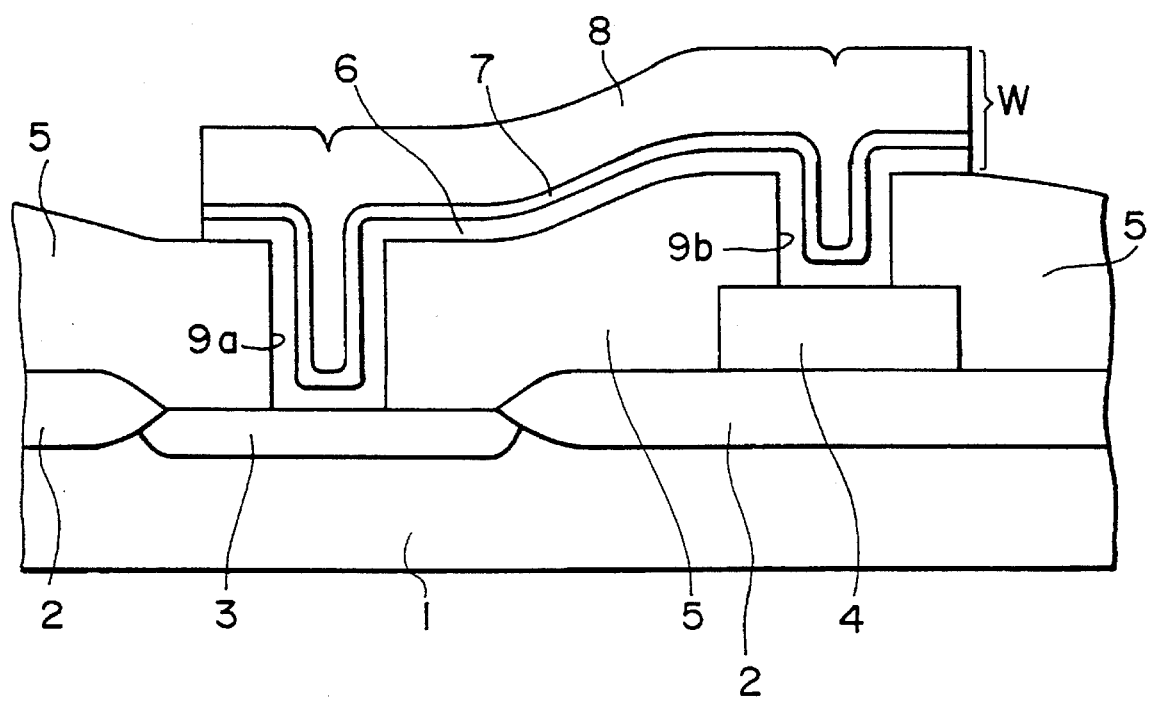
FIG. 1 is a cross-sectional view showing the principal structure of a semiconductor device according to a first embodiment of this invention.

FIG. 1 shows the principal structure of a semiconductor device according to a first embodiment of this invention. FIGS. 3A through 3E show consecutive manufacturing steps for the semiconductor device of the first embodiment.

In the semiconductor device of this embodiment, a conductive layer 3 in the form of an n-type impurity diffusion layer is formed in a semiconductor substrate 1 of p-type silicon, and around the conductive layer 3 an element isolation insulating layer 2 (first insulating layer) is formed. On the element isolation insulating layer 2, a wiring layer 4 made chiefly of silicon is formed. On the surface of the semiconductor substrate 1 at an area including the conductive layer 3, the element isolation insulating layer 2 and the wiring layer 4, an insulating layer 5 (second insulating layer) such as in the form of a silicon oxide layer is formed. In the insulating layer 5, contact holes 9a, 9b communicating respectively with the conductive layer 3 and the wiring layer 4 are formed. In a predetermined area including the contact holes 9a, 9b, a multilayer interconnection layer W is formed. The multilayer interconnection layer W is composed of a conductive silicon layer 6 as a lower layer, a barrier metal layer 7 as an intermediate layer, and a metal wiring layer 8 as an upper layer.

The manufacturing process for the semiconductor device of FIG. 1 will now be described.

(A) In a predetermined area of the semiconductor substrate 1, the conductive layer 3 in the form of an impurity diffusion layer, and the element isolation insulating layer 2 are formed. The semiconductor substrate 1 is a silicon single crystalline wafer in which boron as impurities is diffused in a concentration of about $1 \times 10^{15}$ to $2 \times 10^{17}$ atoms $cm^{-3}$ to make the wafer slightly conductive. The element isolation insulating layer 2 is a silicon oxide layer which is formed in a thickness of 200 to 800 nm by oxidizing the surface of the silicon wafer in a selective pattern. The conductive layer 3 is an impurity diffusion layer in which phosphorous or arsenic as impurities is doped in a dose of $(1 \text{ to } 8) \times 10^{15}$ atoms $cm^{-2}$ by ion implantation and further by thermal diffusion. The impurity concentration of the impurity diffusion layer is about $1 \times 10^{19}$ to $1 \times 10^{21}$ atoms $cm^{-3}$. The thickness of the conductive layer 3 depends on the design of the element or device but usually about 0.1 to 0.5 μm.

Figure 3A:
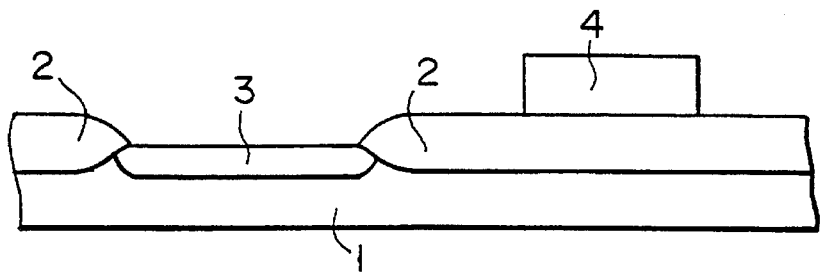
FIGS. 3A through 3E are cross-sectional views showing consecutive manufacturing steps for the semiconductor device of the first embodiment.

Further, the wiring layer 4 made chiefly of silicon is formed on the semiconductor substrate 1 via the element isolation insulating layer 2 (FIG. 3A). In the wiring layer 4, phosphorus is diffused in a concentration of about $1 \times 10^{19}$ to $1 \times 10^{21}$ atoms $cm^{-3}$ to make the wiring layer 4 conductive.

The wiring layer 4 may be a structure in which it is electrically connected with the conductive layer 3 or may be the gate electrode of a MIS transistor as formed on a thin insulating layer of 3 to 100 nm thickness instead of the element isolation insulating layer 2.

Figure 3B:
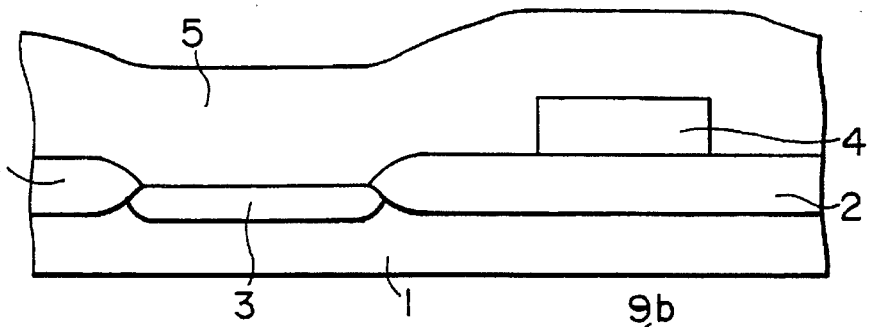

(B) On the semiconductor substrate in the area including the conductive layer 3 and the wiring layer 4, the insulating layer 5 is formed (FIG. 3B). The insulating layer 5 is a silicon oxide layer of 0.2 to 2 μm thickness formed by chemical vapor deposition (hereinafter called "CVD method"). In the silicon oxide layer now generally used in the art, phosphorus or arsenic may be added, and the insulating layer surface may be flat by heat treatment.

Figure 3C:
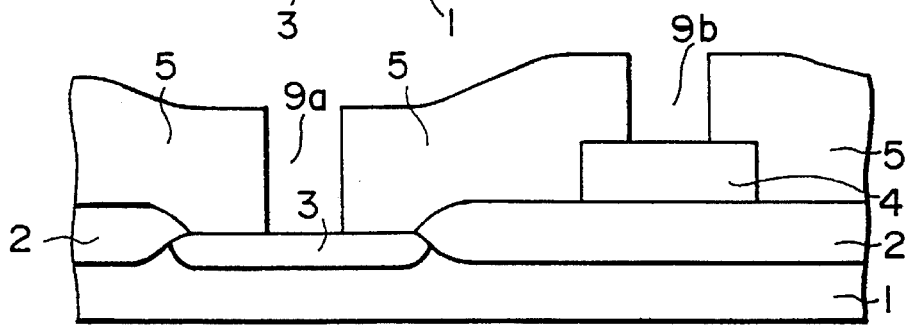

(C) Then, in a predetermined area of the insulating layer 5, contact holes 9a, 9b are formed by usual photolithographic technology or etching technology (FIG. 3C). The purpose of the contact holes 9a, 9b is to form a leading wiring layer to be electrically connected with the conductive region as the lower layer, i.e., the conductive layer 3 and the wiring layer 4. The contact holes 9a, 9b are formed by forming a photoresist, which has openings of 0.3 to 1.0 μm diameter, on the insulating layer 5 as a mask for selective etching, and removing part of the insulating layer 5 to its lower layer, i.e. the conductive region, by anisotropic dry etching with plasma of rare gas of carbon tetrafluoride ($CF_4$) and oxygen ($O_2$), whereupon the photoresist is peeled. The contact holes 9a, 9b have a large depth, compared to the diameter.

Figure 3D:
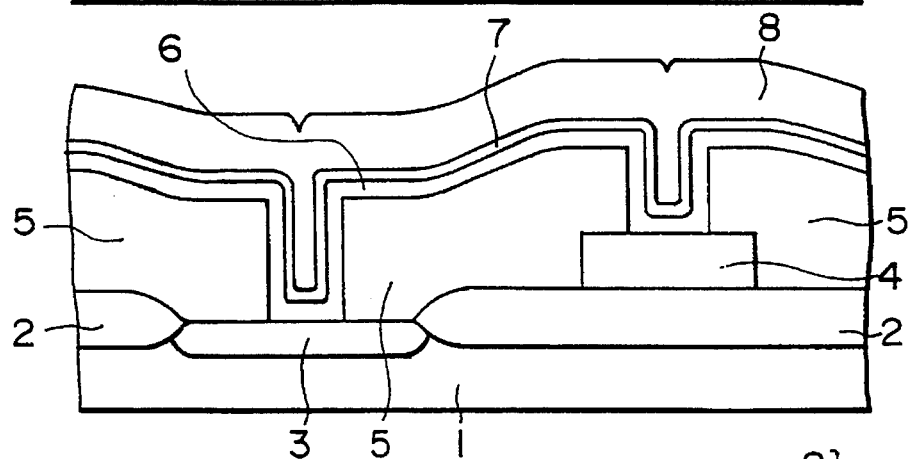

(D) After forming the contact holes 9 (9a, 9b), firstly the conductive silicon layer 6 is formed on the element surface containing the insulating layer 5 and the contact holes 9 by CVD method (FIG. 3D). Since deposition by CVD method enables a uniform-thickness conductive silicon layer even in a small gap, it is possible to form a uniform-thickness conductive silicon layer 6 over the entire surface including the side surface and the bottom surface of the contact holes 9, which are very small in size and great in depth. In order to be conductive, the conductive silicon layer 6 contains impurities such as phosphorus, arsenic or boron; for example, phosphorus is contained in a concentration of $1 \times 10^{19}$ to $1 \times 10^{21}$ atoms $cm^{-3}$ in polycrystalline silicon. In the second embodiment, however, the conductive silicon layer may contain no impurities during the forming process. The thickness of the conductive silicon layer 6 is 3 to 500 nm.

Then a barrier metal layer 7 is formed on the conductive silicon layer 6 (FIG. 3D). The barrier metal layer 7 serves to prevent the conductive silicon layer 6 and a metal wiring layer 8, which is to be formed subsequently, from reacting with each other by heat treatment in a subsequent process. The barrier metal layer 7 is formed of, for example, titanium nitride (TIN) in a thickness of 50 to 200 nm. Alternatively, this barrier metal may be a refractory metal, such as titanium, molybdenum or tungsten, or a compound of such refractory metal and silicon.

The metal wiring layer 8 is formed on the barrier metal layer 7 (FIG. 3D). The metal wiring layer 8 is a conductive layer of 0.2 to 1 μm thickness which contains aluminum as the principal ingredient and copper or silicon as impurities.

Figure 3E:
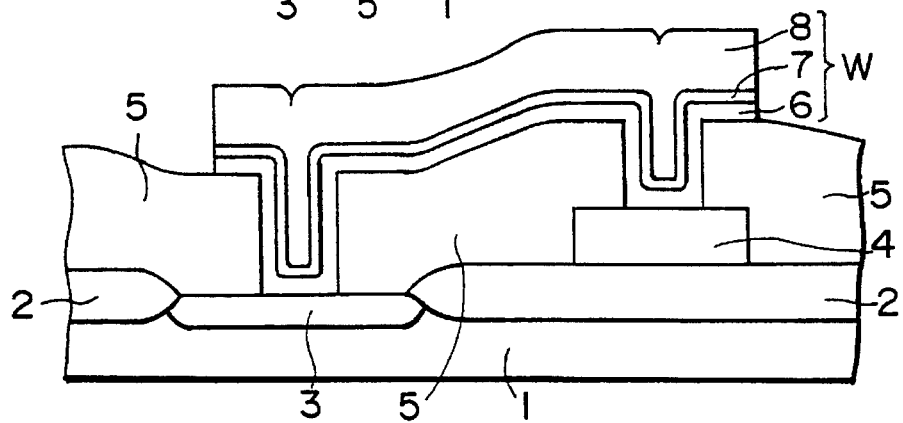

(E) Subsequently, a multilayer interconnection layer W is formed by selectively etching the three-layer wiring layer, i.e. the polycrystalline silicon layer 6, the barrier metal layer 7 and the metal wiring layer 8, by the usual photolithographic technology or etching technology (FIG. 3E). More specifically, a photoresist having a predetermined pattern is formed on the three-layer wiring layer, whereupon using this photoresist as a mask, the three layers are etched in order from the upper layer by anisotropic etching with plasma of rare gas mixture of boron trichloride ($BCl_3$) and chloride ($Cl_2$). Using this plasma etching, it is possible to etch the individual three layers of the wiring layer in the same conditions so that a multilayer interconnection layer W can be formed without any additional process.

In this semiconductor device, the conductive layer 3, in the form of an impurity diffusion layer formed on the semiconductor substrate 1, and the wiring layer 4 made chiefly of silicon are connected with the metal wiring layer 8 via the conductive silicon layer 6. Namely, since the conductive region (i.e., the conductive layer 3 and the wiring layer 4) having the semiconductor property is connected with the metal wiring layer 8 via the semiconductor layer (i.e., the conductive silicon layer 6), this connection is different from the conventional connection between semiconductor and metal. It is therefore possible to minimize the resistance and Shottky barrier due to the difference in energy level, which would have been caused if the conductive layer of semiconductor were in direct contact with metal.

The conductive silicon layer 6 is part of wires and is in contact with the small-resistance metal wiring layer 8 via the barrier metal layer 7 through the entire surface of the layer 6, thus securing an adequately large contact surface. As a result, the contact resistance between the semiconductor conductive silicon layer 6 and the wiring metal layer 8 is small as a whole. In other words, with the semiconductor device of the first embodiment, it is possible to reduce the contact resistance of the wire portions leading from the conductive layer 3, in the form of an impurity diffusion layer of the semiconductor substrate 1, and the wiring layer 4 made chiefly of silicon, as compared to the conventional semiconductor device. It is therefore to achieve good electrical connection even if the contact holes become smaller in diameter according to a miniaturization of semiconductor device.

Figure 2:
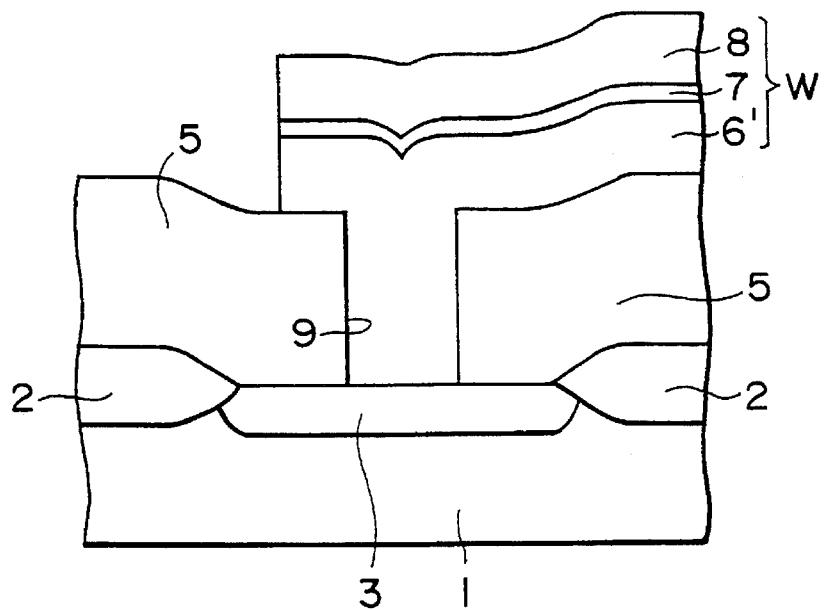
FIG. 2 is a cross-sectional view showing a modification of the semiconductor device of the first embodiment.

In the first embodiment, as shown in FIG. 2, by forming the conductive silicon layer 6' so as to have a thickness of half length of diameter of the contact holes or more, it is possible to fill up the contact holes 9 with the silicon layer 6'. The uneven surface of the contact holes 9 are thereby made flat by the conductive silicon layer 6' so that subsequent processes such as forming the barrier metal layer 7 and the metal wiring layer 8 and forming the protective insulating layer are facilitated. Assuming that the diameter of the contact holes 9 is about 0.6 µm, the thickness of the conductive silicon layer 6' should be at least about 0.3 µm or more so that the conductive silicon layer 6' can be formed with the contact holes filled up.

Second Embodiment

Figure 4:
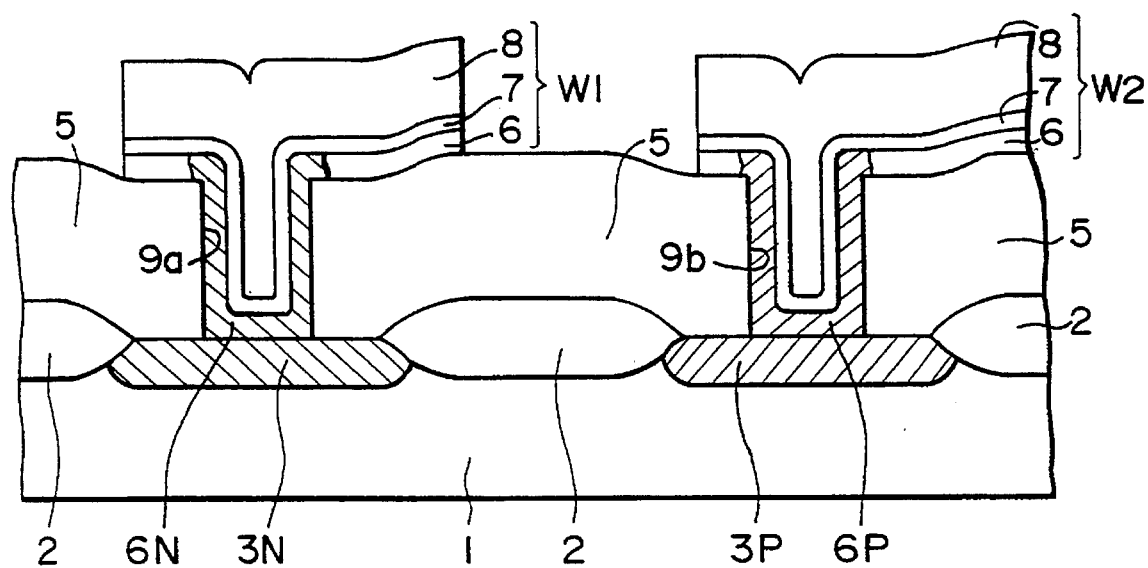
FIG. 4 is a cross-sectional view showing the structure of another semiconductor device according to a second embodiment of the invention.

FIG. 4 shows the principal structure of a semiconductor device according to a second embodiment of this invention. FIGS. 5A through 5E show a first manufacturing method for the semiconductor device of the second embodiment. FIGS. 6A through 6E show a second manufacturing method for the semiconductor device of the second embodiment.

The semiconductor device of this embodiment is similar to that of the first embodiment except that the individual conductive region is a conductive layer 3N, 3P in the form of an impurity diffusion layer formed in the semiconductor substrate 1. The insulating layer 5 has contact holes 9a, 9b communicating with the respective conductive layers 3N, 3P. On the insulating layer 5 at a predetermined area including the respective contact holes 9a, 9b, multilayer interconnection layers W1, W2 to be connected with the respective conductive layers 3N, 3P are formed. Each of the multilayer interconnection layers W1, W2 is in a three-layer structure composed of the conductive silicon layer 6, the barrier metal layer 7 and the metal wiring layer 8. In the conductive silicon layer 6 of the multilayer interconnection layer W1, impurities of the same type as that of the conductive layer 3N are doped in portions existing at least in the contact hole 9a. In the conductive silicon layer 6 of the multilayer interconnection layer W2, impurities of the same type as that of the conductive layer 3P are doped in portions in the contact region. The elements or parts substantially similar in function to those of the semiconductor device of the first embodiment are designated like reference numerals.

The manufacturing process of the semiconductor device of FIG. 4 will now be described.

(A) In the first manufacturing method, conductive layers 3 (3N, 3P) in the form of a p-type or n-type impurity diffusion layer are formed in predetermined different areas of the semiconductor substrate 1, while an element isolation insulating layer 2 is formed in the remaining portions. The semiconductor 1 is a p-type silicon single crystalline wafer in which boron as impurities is diffused in a concentration of about $1 \times 10^{15}$ to $2 \times 10^{17}$ atoms $cm^{-3}$ to make the wafer slightly conductive. The element isolation insulating layer 2 is a silicon oxide layer which is formed in a thickness of 200 to 800 nm by oxidizing the surface of the silicon wafer in a selective pattern. The conductive layers 3N, 3P have different polarities; the conductive layer 3N is an n-type impurity diffusion layer containing phosphorous or arsenic as impurities in a concentration of $1 \times 10^{19}$ to $1 \times 10^{21}$ atoms $cm^{-3}$, and the conductive layer 3P is a p-type impurity diffusion layer containing boron as impurities in a concentration of $1 \times 10^{19}$ to $1 \times 10^{21}$ atoms $cm^{-3}$.

Figure 5A:
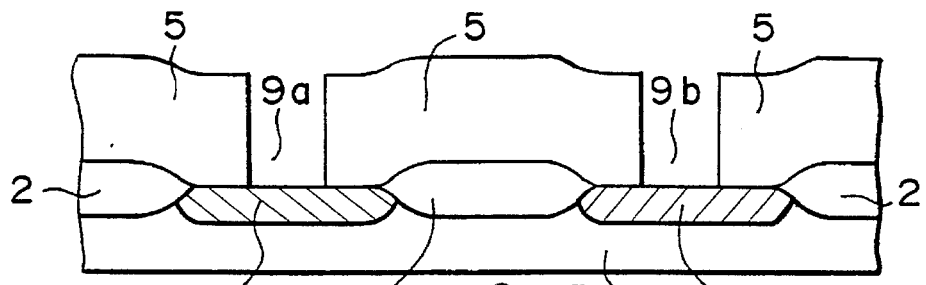
FIGS. 5A through 5E are cross-sectional views showing consecutive manufacturing steps for the semiconductor device of the second embodiment.

Then, on the semiconductor substrate including the conductive layers 3N, 3P, an insulating layer 5 is formed, whereupon contact holes 9a, 9b communicating with the respective conductive layers 3N, 3P are formed at predetermined areas of the insulating layer 5 (FIG. 5A).

Figure 5B:
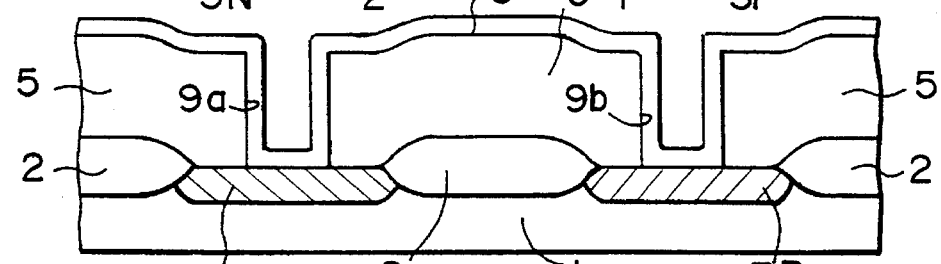

(B) Subsequently, a conductive silicon layer 6 is formed over the insulating layer 5 and the contact holes 9a, 9b by the CVD method. Since deposition by CVD method enables a uniform-thickness conductive silicon layer even in a small gap, it is possible to form a uniform-thickness polycrystalline silicon layer 6 over the entire surface including the side surface and the bottom surface of the contact holes 9 (FIG. 5B). The thickness of the polycrystalline silicon layer 6 is 3 to 500 nm.

(C) The conductive silicon layer of this embodiment contains no impuries during the forming process. Such a polyscrystalline silicon layer containing no impuries has a very high resistance and is therefore unsuitable for a wiring layer. Consequently, impurities are doped in the silicon layer existing at least in the contact holes 9a, 9b in order to make the silicon layer adequately conductive. Specifically, the polycrystalline layer in the contact hole 9a formed on the conductive layer 3N in the form of an n-type impurity diffusion layer is an n-type conductive silicon layer 6N. The polycrystalline silicon layer in the contact hole 9b formed on the conductive layer 3P in the form of a p-type impurity diffusion layer is a p-type conductive silicon layer 6P.

Figure 5C:
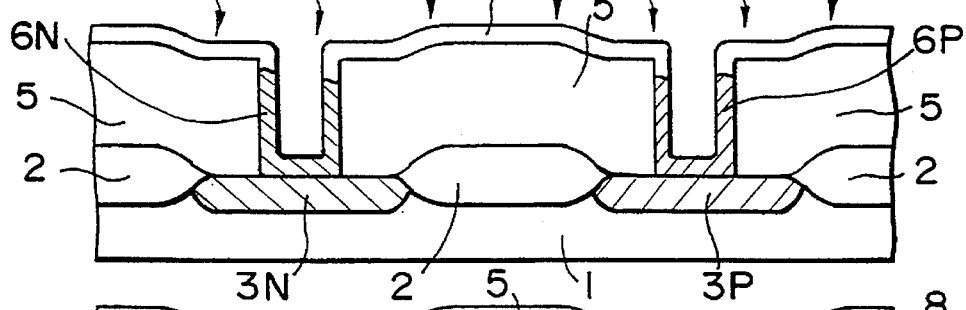

After forming the polycrystalline silicon layer 6, these conductive silicon layers 6N, 6P are formed by diffusing impurities in the polycrystalline silicon layer from the respective conductive layers 3N, 3P by heat treatment (FIG. 5C). For example, by heat treatment in nitrogen atmosphere at a temperature of 800° to 1100° C. for 10 to 60 minutes, phosphorus or arsenic is diffused into the polycrystalline silicon layer, which is deposited on the inner wall of the contact hole 9a on the n-type impurity diffusion layer 3N, to form an n-type conductive silicon layer 6N. And boron is diffused into the polycrystalline silicon layer, which is deposited on the inner wall of the contact hole 9b on the p-type impurity diffusion layer 3P, to form a p-type conductive silicon layer 6P. Therefore, according to this method, in self alignment, the conductive silicon layer 6N on the conductive layer 3N of the n-type impurity diffusion layer will become an n-type, and the conductive silicon layer 6P on the conductive layer 3P of the p-type impurity diffusion layer will become a p-type.

Generally, in a semiconductor device such as of a CMOS transistor, a bipolar impurarity diffused regions of different conductive type are formed in the same semiconductor substrate by diffusing n-type and p-type impurities in different areas. Therefore, in the case where leading wires are to be formed chiefly of a semiconductor substance such as polycrystalline silicon from the respective impurity diffusion regions, if the doping polarity of the wire material is different from that of the impurity diffusion layer, a p-n diode would be formed at a portion where the surface of the impurity diffusion layer and the wiring layer are in contact with each other so that the leading wires are difficult to use. It is therefore necessary that the conductive layer and the polycrystalline silicon layer in the semiconductor substrate have the same doping polarity.

Figure 5D:
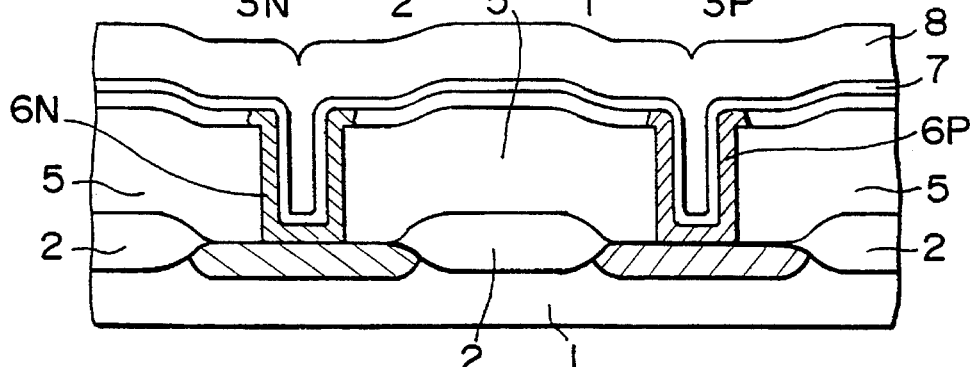
Figure 5E:
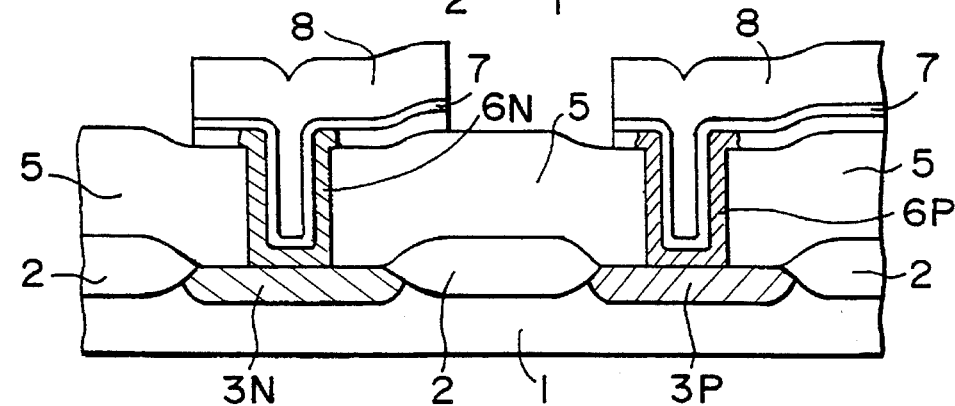

(D) Then, a barrier metal layer 7 is formed on the polycrystalline silicon layers 6 (6N, 6P), and a metal wiring layer 8 is formed on the barrier metal layer 7 (FIG. 5D). The barrier metal layer 7 is formed of titanium nitride (TIN) in a thickness of 50 to 200 nm. The metal wiring layer 8 is a conductive layer of 0.2 to 1 µm thickness which contains aluminum as the principal ingredient and copper or silicon as impurities.

(E) Subsequently, multilayer interconnection layers W1, W2 are formed each by selectively etching the three-layer wiring layer, i.e. the polycrystalline silicon layer 6 having the conductive regions 6N, 6P, the barrier metal layer 7 and the metal wiring layer 8, so as to leave only the wiring layer portions unetched using the usual photolithographic technology or etching technology.

Figure 6A:
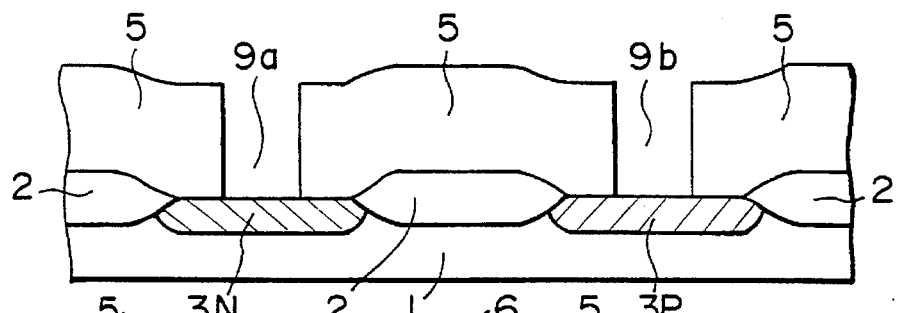
FIGS. 6A through 6E are cross-sectional views showing alternative consecutive manufacturing steps for the semiconductor device of the second embodiment.
Figure 6B:
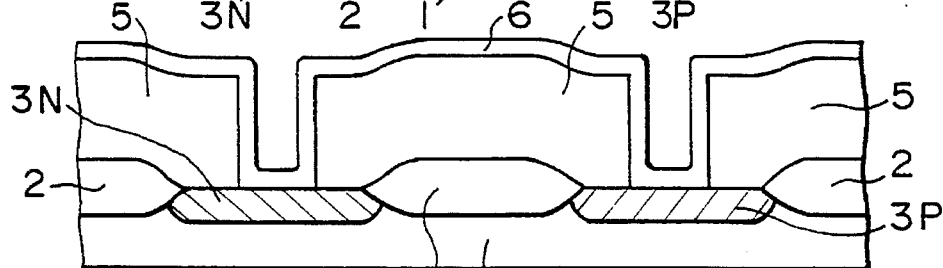
Figure 6C:
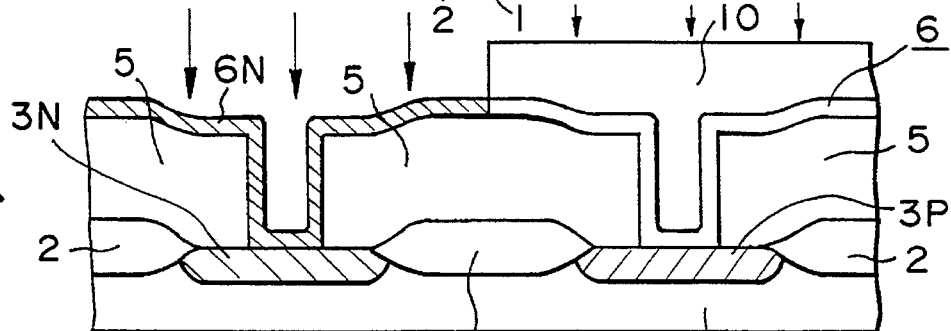
Figure 6D:
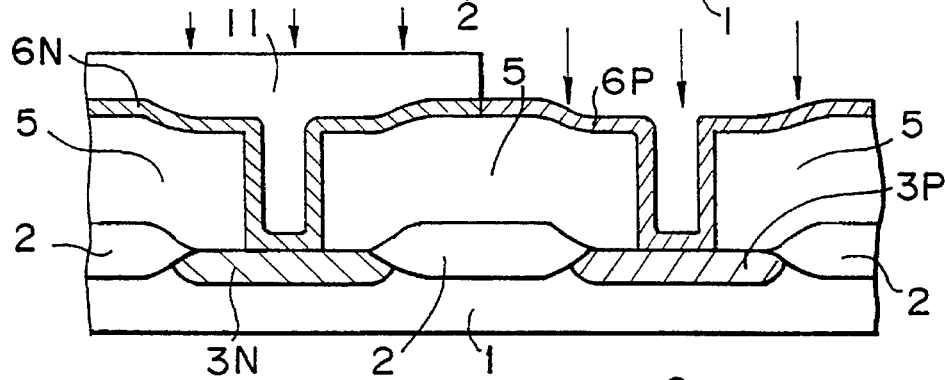

In the second manufacturing method for the semiconductor device of the second embodiment, after the processes similar to the processes of FIGS. 5A and 5B (FIGS. 6A and 6B), a photoresist layer 10 is formed at the area toward the p-type impurity diffusion layer 3P, whereupon using this photoresist layer as a mask, n-type impurities such as phosphorus or arsenic are doped in the polycrystalline silicon layer 6 in a dose of (0.1 to 10)×10$^{15}$ atoms cm$^{-2}$ by ion implantation (FIG. 6C). After removing of the photoresist layer 10, a photoresist layer 11 is formed at the area toward the n-type impurity diffusion layer 3N, whereupon p-type impurities such as boron is doped in the polycrystalline silicon layer 6 in a dose of (0.1 to 10)×10$^{15}$ atoms cm$^{-2}$ by ion implantation (FIG. 6D). Then the photoresist layer 11 is removed.

After heat treatment in nitrogen atmosphere at a temperature of 800° to 1100° C., an n-type conductive silicon layer 6N is formed on the n-type impurity diffusion layer 3N, while a p-type conductive silicon layer 6P is formed on the p-type impurity diffusion layer 3P. The impurity concentration of these conductive silicon layers 6N, 6P is in a range of about 1×10$^{18}$ to 1×10$^{21}$ atoms cm$^{-3}$.

Figure 6E:
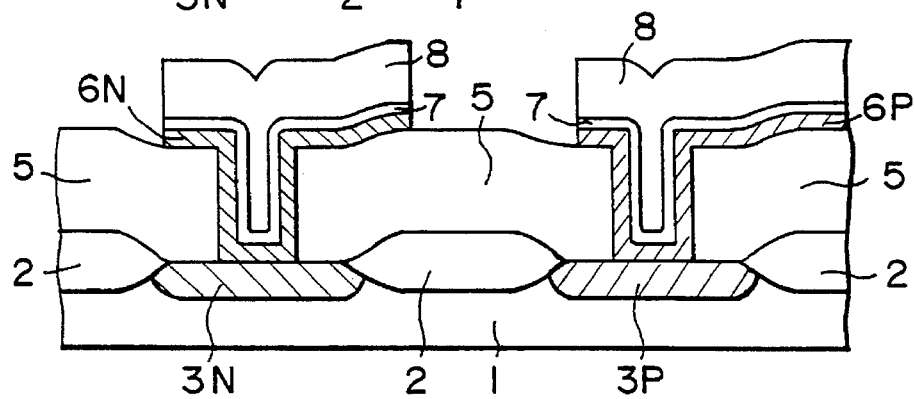

Then a barrier metal layer 7 is formed on the polycrystalline silicon layer 6 (6N, 6P), and a metal wiring layer 8 is formed on the barrier metal layer 7, whereupon these three layers of the wiring layer, i.e. the polycrystalline silicon layer 6, the barrier metal layer 7 and the metal wiring layer are selectively etched so as to leave only the wire portions unetched using the usual photolithographic technology or etching technology (FIG. 6E).

In the second manufacturing method for the semiconductor device of the second embodiment, it is possible to control the resistance of the polycrystalline silicon layer 6 by varying the amount of impurities to be injected by ion implantation, and also it is possible to form a wiring layer having a resistance (e.g., the wiring layer 4 of FIG. 1) at predetermined areas of the semiconductor device. Further, by locally forming the conductive silicon layer in which the impurity ions of the doping polarity different from that of the impurity diffusion layer in the semiconductor substrate are injected, it is possible to form a semiconductor device in which a diode is connected in series with part of the contact holes.

In the semiconductor device of FIG. 4, the wire portions leading from the conductive layer 3 having the property of a semiconductor are connected with the conductive silicon layer 6. The doping polarity of the conductive silicon layer 6N connected with the conductive layer 3N of the n-type impurity diffusion layer is negative, while the doping polarity of the polycrystalline silicon layer 6P connected with the conductive layer 3P of the p-type impurity diffusion layer is positive. In other words, since the impurity diffusion layers 3N, 3P are connected with the respective conductive silicon layers 6N, 6P as the leading wire layers via the semiconductors of the same doping polarity, it is possible to obtain good electrical connection. Further, the conductive silicon layers 6N, 6P are in contact with the low-resistance wiring metal layer 8 via the barrier metal layer 7 at the entire surface of the respective conductive silicon layer, and therefore the contact resistance between the conductive silicon layer and the metal wiring layer is small as a whole.

With the semiconductor device of the second embodiment, it is possible to reduce the contact resistance of the wire portions leading from the impurity diffusion layers 3N, 3P of the semiconductor substrate, as compared to the conventional semiconductor device. It is therefore to achieve good electrical connection even if the contact holes become smaller in diameter according to a miniaturization of a semiconductor devices.

Third Embodiment

Figure 7:
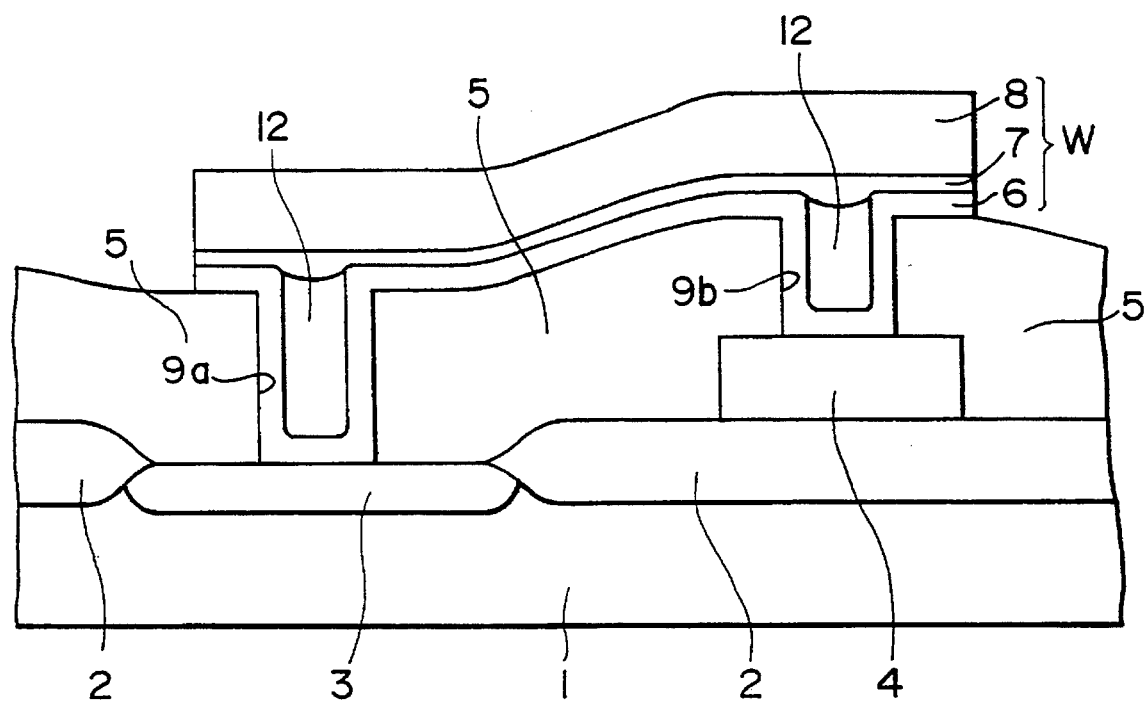
FIG. 7 is a cross-sectional view showing the structure of still another semiconductor device according to a third embodiment of the invention.

FIG. 7 shows the principal structure of a semiconductor device according to a third embodiment of this invention by a cross-sectional view. FIGS. 8A through 8D show consecutive manufacturing steps for the semiconductor device of the third embodiment.

The semiconductor device of this embodiment is similar in construction to that of the first embodiment except the structure of the multilayer interconnection layer W. In this multilayer interconnection layer W, central recesses to be formed when the conductive silicon layer 6 along the inner wall of the contact holes 9a, 9b are filled up with the insulating layer 12 until a top surface of the insulating layer 12 is on a relatively flat level with the conductive silicon layer 6 formed around the contact hole.

This semiconductor device is manufactured in the following processes:

(A) A conductive layer 3 in the form of an impurity diffusion layer is formed in a predetermined area of the semiconductor substrate 1, while an element isolation insulating layer 2 (first insulating layer) is formed in the remaining area. The semiconductor substrate 1 is a silicon single crystalline wafer in which boron as impurities is diffused in a concentration of about $1\times10^{15}$ to $2\times10^{17}$ atoms $cm^{-3}$ to make the wafer slightly conductive. The element isolation insulating layer 2 is a silicon oxide layer which is formed in a thickness of 200 to 800 nm by oxidizing the surface of the silicon wafer in a selective pattern. The conductive layer 3 is an impurity diffusion layer in which arsenic as impurities is injected in a dose of $(1\ to\ 8)\times10^{15}$ atoms $cm^{-2}$ by ion implantation and further by thermal diffusion. A wiring layer 4 made chiefly of silicon is formed on the semiconductor substrate 1 via the element isolation insulating layer 2. In the wiring layer 4, phosphorus is diffused in a concentration of about $1\times10^{19}$ to $1\times10^{21}$ atoms $cm^{-3}$ to make the wiring layer 4 conductive. On the semiconductor substrate at areas including the conductive layer 3 and the first wiring layer 4, an insulating layer 5 (second insulating layer) is formed by the CVD method. In the insulating layer 5, two contact holes 9 communicating respectively with the conductive layer 3 and the wiring layer 4. Then a conductive silicon layer 6 is formed on the surface of the insulating layer 5 at the area including the contact holes 9.

In order to make the conductive silicon layer 6 conductive, impurities such as phosphorus are diffused in it in a concentration of $1\times10^{19}$ to $1\times10^{21}$ atoms $cm^{-3}$. The conductive silicon layer 6 is formed by, for example, the CVD method. As mentioned above in connection with the first embodiment, the thickness of silicon covering the uneven portions of the contact holes 9 must be uniform. If the conductive silicon layer 6 has a small thickness less than the radius of the contact holes 9, a recess whose depth is larger than the diameter of the contact holes 9, namely, a recess whose aspect ratio is large is formed.

To the recess whose aspect ratio is large, as mentioned above in connection with the related art, the step coverage of the wiring metal and in particular the metal wiring layer chiefly of aluminum is remarkably poor, which would deteriorate the reliability of the wiring layer.

As mentioned above in connection with the first embodiment, this problem can be avoided if the conductive silicon layer 6 has a thickness half length of diameter of the contact holes 9 or more to fill up the open portions of the contact holes 9. According to this method, since the thickness of the conductive silicon layer 6 as part of the multilayer interconnection layer W is large, the working property of the multilayer interconnection layer would be lowered. Further, since the unevenness of the surface of the multilayer interconnection layer is considerable, the step coverage such as of the protective layer stacked after the wiring layer has been formed would become poor.

(B) According to the third embodiment, in order to solve this problem, the recesses, whose aspect ratio is large, of the contact holes 9 are filled up with the insulating layer 12. In other words, the insulating material is deposited on the surface of the conductive silicon layer 6 so as to fill up the recesses of the contact holes 9. Particularly preferably, the insulating material is made chiefly of silicon oxide ($SiO_2$). The forming method of the insulating layer is exemplified by the CVD method, a method in which a coating is formed using of a silanol solution and the coating is then thermally treated, and a method in which part of a layer chiefly of polycrystalline silicon is converted into a silicon oxide layer by thermal oxidation in vapor atmosphere or oxygen atmosphere.

Figure 8A:
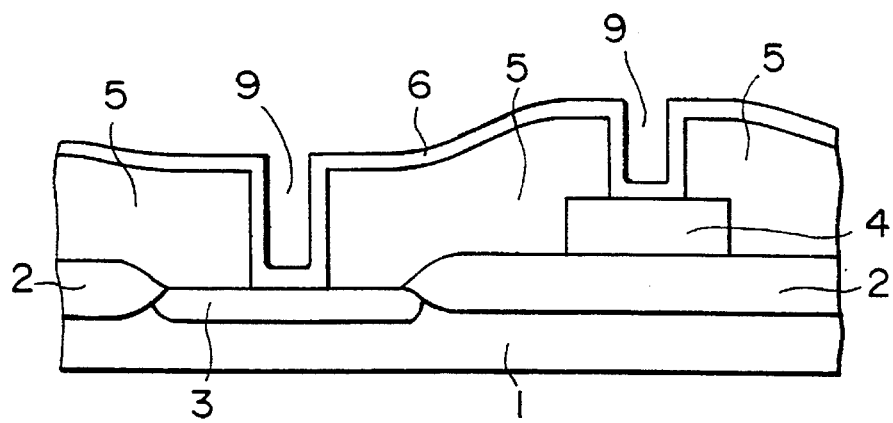
FIGS. 8A through 8D are cross-sectional views showing consecutive manufacturing steps for the semiconductor device of the third embodiment.
Figure 8B:
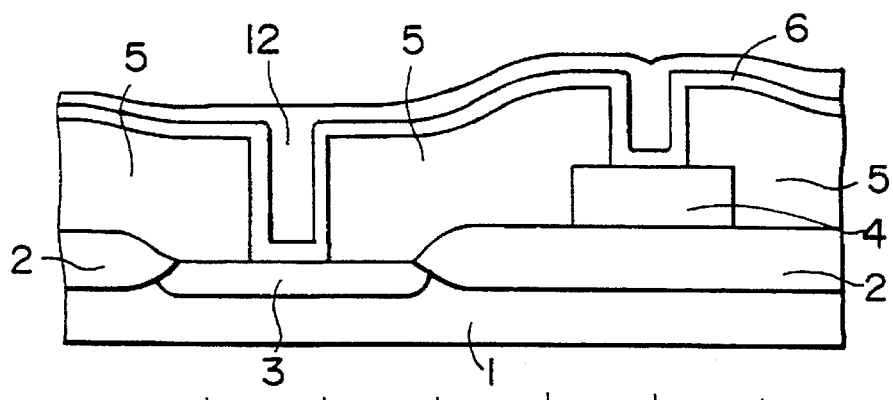

In this embodiment, the method using a silanol solution is used as an illustrative example. Silanol is a substance in which part of atoms of alcohol molecule is substituted by silicon. By volatilizing the alcoholic content with heat treatment, a coating of silanol solution can be metamorphosed into a silicon oxide layer. When this silanol solution is coated over the conductive silicon layer 6 by spin coating for example, the solution stays in a recess of the contact hole 9 and becomes a thin film on a flat portion. Then by thermally treating the semiconductor substrate at a temperature of 300° to 900° C., it is possible to metamorphose the silanol solution into silicon oxide, thus forming an insulating layer 12 (FIG. 8B). The insulating layer 12 fills up the recess of the contact hole 9 and has a small thickness of about 10 to 500 nm on flat portions so that its whole surface will be flat.

Figure 8C:
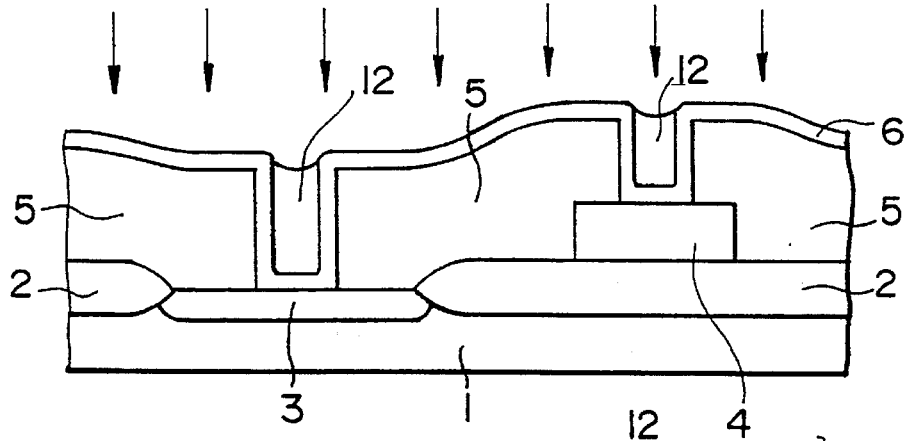

(C) Then, part of the insulating layer 12 is removed by a predetermined thickness, e.g. 50 to 500 nm, by anisotpic dry etching (FIG. 8C). Dry etching may be plasma etching using a rare gas mixture of carbon tetrafluoride ($CF_4$) and oxygen ($O_2$). As a result of this process, only the recess of the contact hole 9 is filled up with the insulating layer 12, while at the remaining portions the conductive silicon layer 6 is exposed. A top surface of the insulating layer 12 filled in the recess of the contact hole 9 is on a relatively flat level with respect to the remaining portions of the conductive silicon layer 6.

Figure 8D:
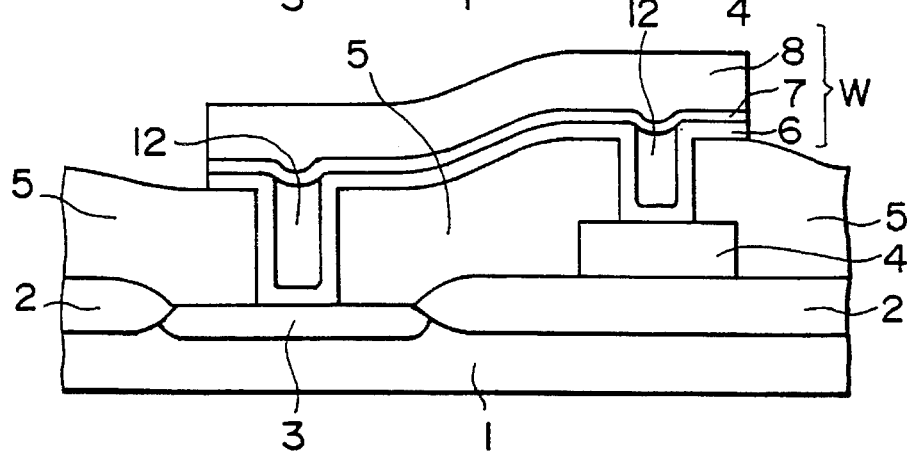

(D) Subsequently, a barrier metal layer 7 is formed over the conductive silicon layer 6 and the insulating layer 12, and a metal wiring layer 8 is formed over the barrier metal layer 7. These three layers of the wiring layer, i.e. the conductive silicon layer 6, the barrier metal layer 7 and the metal wiring layer 8, are then removed in a selective pattern so as to leave only the prospective wire portions unetched, using the usual photolithographic technology or etching technology, thus forming a multilayer wiring layer W (FIG. 8D).

In the semiconductor device of FIG. 7, since the conductive silicon layer 6 in the form of an impurity diffusion layer, which has the semiconductor property, and the wiring layer 4 made chiefly of silicon are connected with the metal wiring layer 8 via the conductive silicon layer 6, which has the semiconductor property, good connection can be obtained, compared to the direct connection between the semiconductor and metal. Further, since the conductive silicon layer 6 is in contact with the low-resistance metal wiring layer 8 at its entire surface via the barrier metal layer 7, the contact resistance between the conductive silicon layer 6 and the metal wiring layer 8 is small as a whole. Since the step (recess) of the contact hole is made flat using the insulating layer 12, good step coverage of the wiring metal layer can be achieved. With the semiconductor of the third embodiment, it is therefore possible to make the contact resistance smaller at the leading wire portions leading from the impurity diffusion layer 3 of the semiconductor substrate 1 and the wiring layer 4 made chiefly of silicon, as compared to the conventional semiconductor device.

Fourth Embodiment

Figure 9:
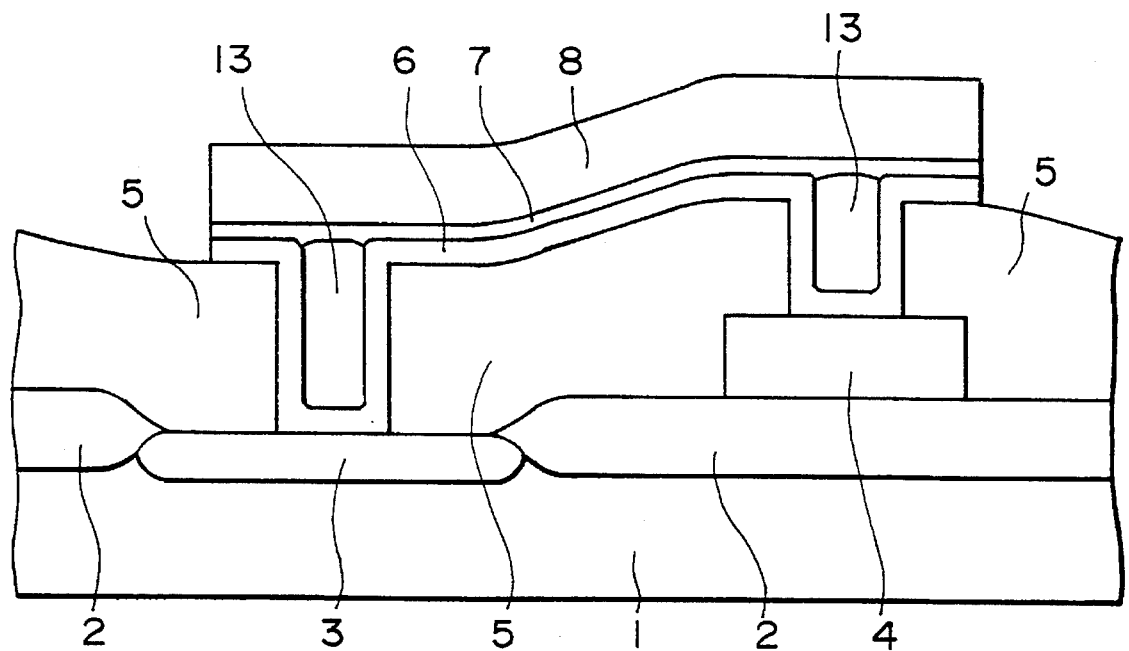
FIG. 9 is a cross-sectional view showing the structure of a further semiconductor device according to a fourth embodiment of the invention.

FIG. 9 shows the principal structure of a semiconductor device by a cross-sectional view according to a fourth embodiment of this invention. FIGS. 11A through 11D show consecutive manufacturing steps for the semiconductor device of the fourth embodiment.

The semiconductor device of this embodiment is similar in construction to that of the third embodiment except that the recess of the contact hole 9 is filled up with a metal layer 13 instead of the insulating layer 12.

Figure 11A:
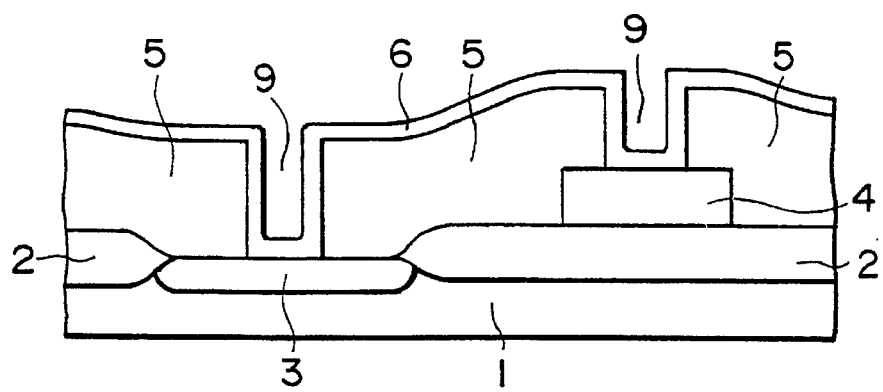
FIGS. 11A through 11D are cross-sectional views showing consecutive manufacturing steps for the semiconductor device of the fourth embodiment.

This semiconductor device is manufactured in the following processes:

(A) A conductive layer 3 in the form of an impurity diffusion layer is formed in a predetermined area of the semiconductor substrate 1, while an element isolation insulating layer 2 (first insulating layer) is formed in the remaining area. The semiconductor 1 is a silicon single crystal wafer in which boron as impurities is diffused in a concentration of about $1\times10^{15}$ to $2\times10^{17}$ atoms cm$^{-3}$ to make the wafer slightly conductive. The element isolation insulating layer 2 is a silicon oxide layer which is formed in a thickness of 200 to 800 nm by oxidizing the surface of the silicon wafer in a selective pattern. The conductive layer 3 is an impurity diffusion layer in which arsenic as impurities is injected in a dose of $(1 \text{ to } 8)\times10^{15}$ atoms cm$^{-2}$ by ion implantation and further by thermal diffusion. The impurity concentration of the impurity diffusion layer is in a range of about $1\times10^{19}$ to $1\times10^{21}$ atoms cm$^{-3}$. A wiring layer 4 made chiefly of silicon is formed on the semiconductor substrate 1 via the element isolation insulating layer 2. In the wiring layer 4, phosphorus is diffused in a concentration of about $1\times10^{19}$ to $1\times10^{21}$ atoms cm$^{-3}$ to make the wiring layer 4 conductive. On the semiconductor substrate in the area including the conductive layer 3 and the wiring layer 4, an insulating layer 5 (second insulating layer) is formed by the CVD method. In the insulating layer 5, contact holes 9 communicating respectively with the conductive layer 3 and the wiring layer 4 are formed. Then a conductive silicon layer 6 is formed on the surface of the insulating layer 5 at the area including the contact holes 9 (FIG. 11A). In order to make the conductive silicon layer 6 conductive, impurities such as phosphorus are diffused in it in a concentration of $1\times10^{19}$ to $1\times10^{21}$ atoms cm$^{-3}$. The conductive silicon layer 6 is formed in a thickness of 3 to 500 nm by the CVD method, for example. At that time, if the conductive silicon layer 6 has a smaller thickness than the half length of diameter of the contact holes 9, a recess whose depth is larger than the diameter of the contact holes 9, namely, a recess whose aspect ratio is large is formed.

To the recess whose aspect ratio is large, as mentioned above in connection with the related art, the step coverage of the wiring metal and in particular the metal wiring layer chiefly of aluminum is remarkably poor, which would deteriorate the reliability of the wiring layer. This problem can be avoided if the contact holes are filled up with conductive polycrystalline silicon layer, as described above in connection with the first embodiment, or if the recesses of the contact holes are filled up with the insulating layer. According to this method, since a thin layer chiefly of polycrystalline silicon is interposed as a series resistance between the conductive layer 3 or the wiring layer 4 and the metal wiring layer 8, the contact resistance between the conductive layer and the wires would increase.

Figure 11B:
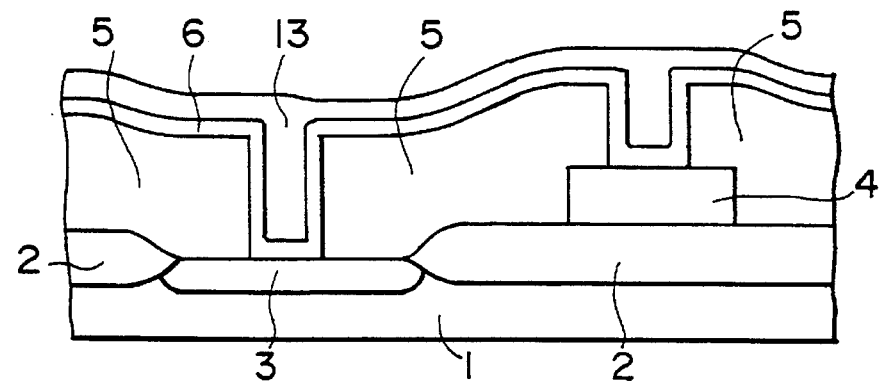
Figure 11C:
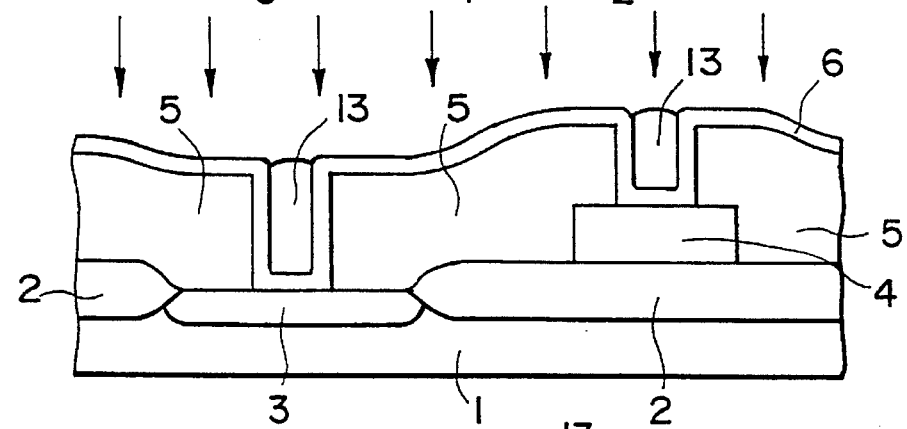
Figure 11D:
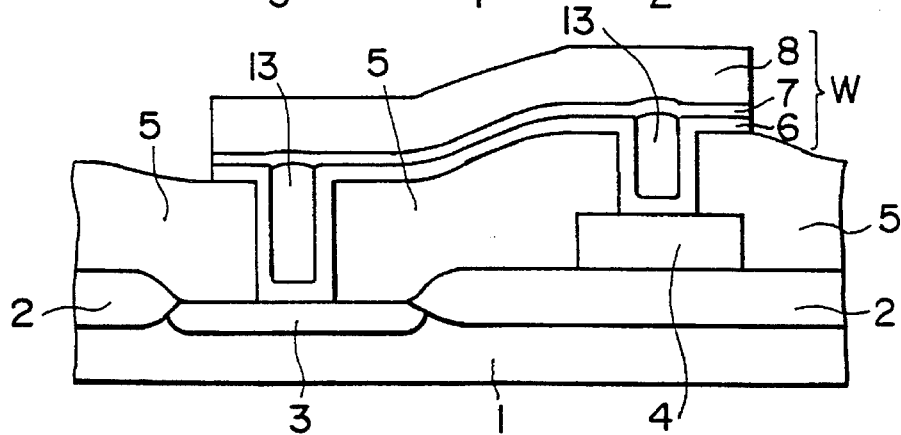
Figure 12A:
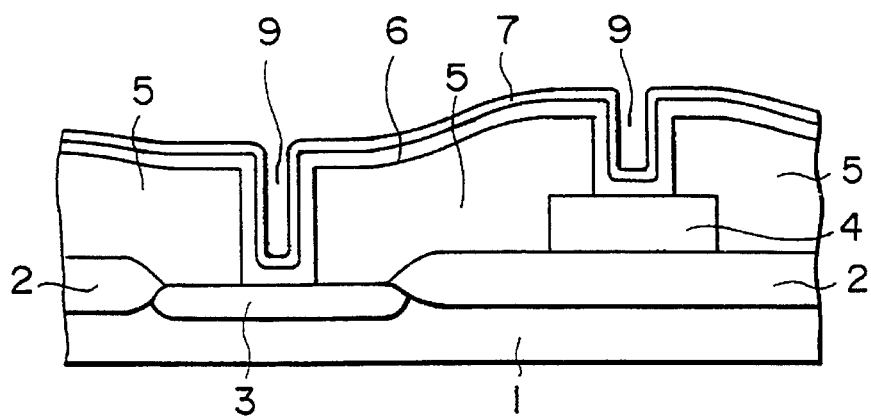
FIGS. 12A through 12D are cross-sectional views showing alternative consecutive manufacturing steps for the semiconductor device of the fourth embodiment.
Figure 12B:
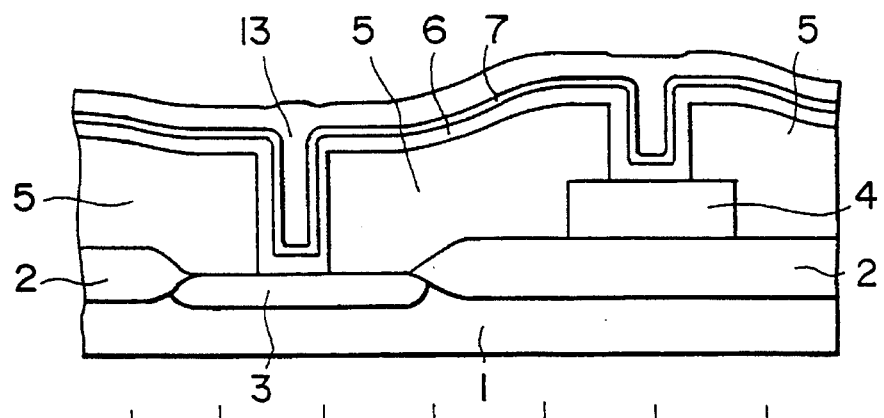
Figure 12C:
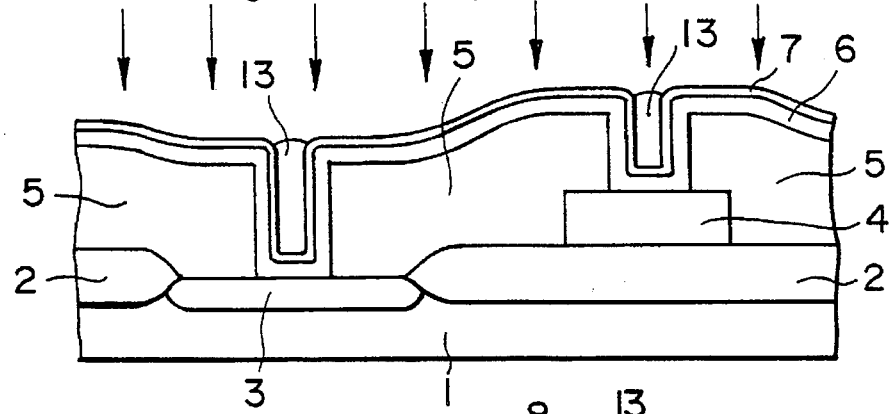
Figure 12D:
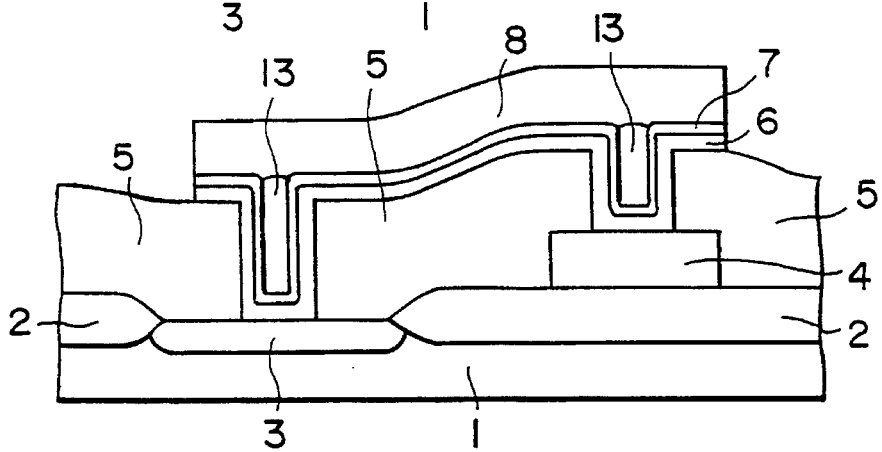

(B) In order to solve this problem, the recesses, whose aspect ratio is large, of the contact holes 9 are filled up with a refractory metal layer 13 after the conductive silicon layer 6 has been formed. For this purpose, the refractory metal layer 13 is formed over the conductive silicon layer 6 so as to fill up the recess of the contact hole (FIG. 11B). The refractory metal layer 13 is formed by depositing a tungsten metal layer such as by the CVD method. Specifically, tungsten is deposited by thermal reaction between tungsten hexafluoride (WF$_6$) and silane (SiH$_4$) or between WF$_6$ and hydrogen (H$_2$). If the thickness of the tungsten layer is in a range of 50 to 500 nm, it is possible to fill up the recess of the contact hole.

(C) Then, the surface of the refractory metal layer 13 is removed selectively by dry etching. Specifically, using physical etching with plasma of rare argon gas, the refractory metal layer of, for example, 100 to 500 nm thickness is selectively etched. As a result, the refractory metal is left over only the recess portion of the contact hole 9 so that the conductive silicon layer 6 is exposed at the remaining portions. A top surface of the refractory metal layer 13 filled in the recess of the contact hole is on a relatively flat level with respect to the remaining portions of the conductive silicon layer 6.

(D) Subsequently, a barrier metal layer 7 is formed over the conductive silicon layer 6 and the refractory metal layer 13, and a metal wiring layer 8 is formed over the barrier metal layer 7. These three layers of the wiring layer, i.e. the conductive silicon layer 6, the barrier metal layer 7 and the metal wiring layer 8, are then removed in a selective pattern so as to leave only the prospective wire portions unetched.

In this embodiment, after forming the conductive silicon layer 6, the refractory metal layer 13 is formed and then the barrier metal layer 7 is formed. Alternatively, as shown in FIGS. 12A through 12D, the barrier metal layer 7 may be formed after forming the conductive silicon layer 6, whereupon the refractory metal layer 13 may be filled up the recess of the contact hole 9. The device to be obtained by this alternative method, namely, also the structure of FIG. 10 should by no means depart from the scope of this invention.

Figure 10:
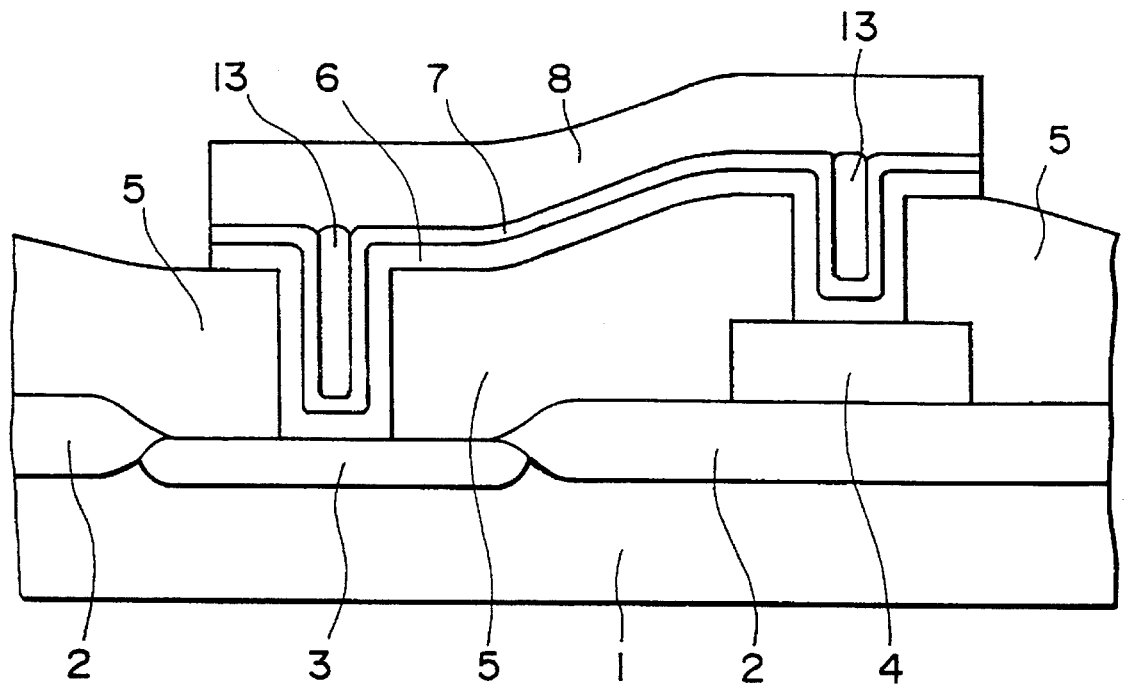
FIG. 10 is a cross-sectional view showing a modification of the semiconductor device of the fourth embodiment.

In the semiconductor devices of FIGS. 9 or 10, since the conductive layer 3 in the form of an impurity diffusion layer, and the wiring layer 4 made chiefly of silicon are connected with the metal wiring layer 8 via the polycrystalline silicon layer 6, good connection can be obtained, compared to the direction connection between the semiconductor and metal. Further, since the conductive silicon layer 6 is in contact with the metal wiring layer 8 at its entire surface via the barrier metal layer 7, the contact resistance between the conductive silicon layer 6 and the metal wiring layer 8 is low as a whole. Since the step (recess) of the contact hole is made flat using the refractory metal layer 13, good step coverage of the wiring metal layer can be achieved. In the embodiment shown in FIG. 10, the top surface of the low-resistant metal layer 13 is on a relatively flat level with respect to the barrier metal layer 7. Also in the contact hole, the low-resistance metal layer 13 exists. With the semiconductor of the fourth embodiment, it is therefore possible to make the contact resistance smaller at the leading wire portions leading from the impurity diffusion 3 of the semiconductor substrate 1 and the wiring layer 4 made chiefly of silicon, as compared to the conventional semiconductor device.

Fifth Embodiment

Figure 13A:
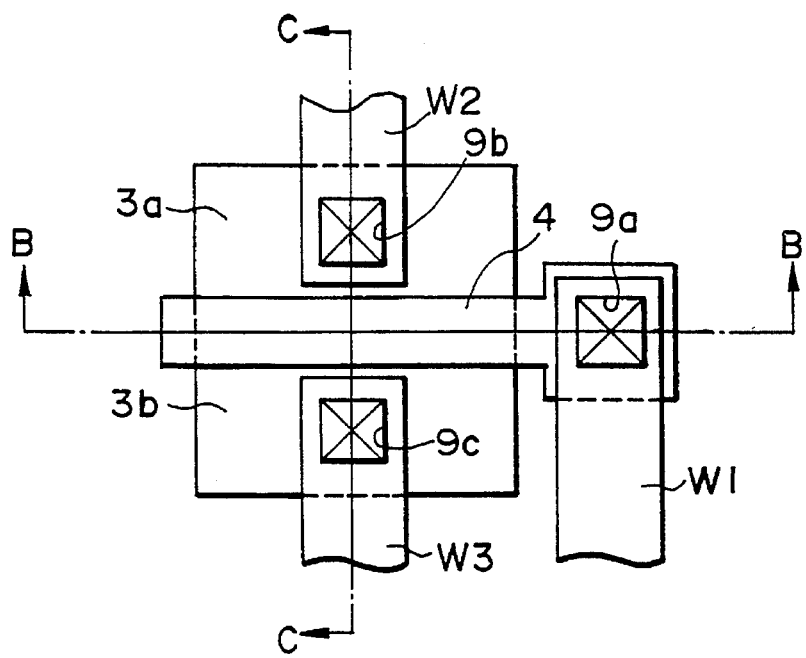
FIG. 13A is a schematic plan view showing a MOSFET to which the invention is applied.
Figure 13B:
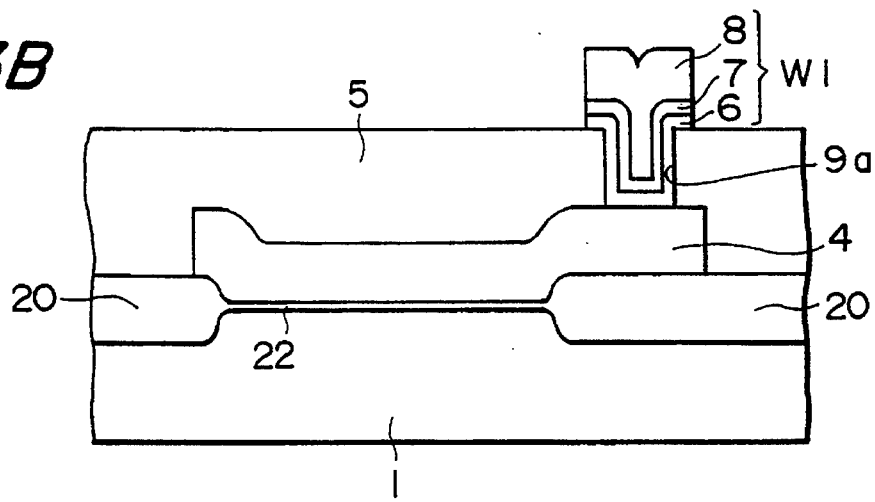
FIG. 13B is a cross-sectional view taken along line B—B of FIG. 13A.
Figure 13C:
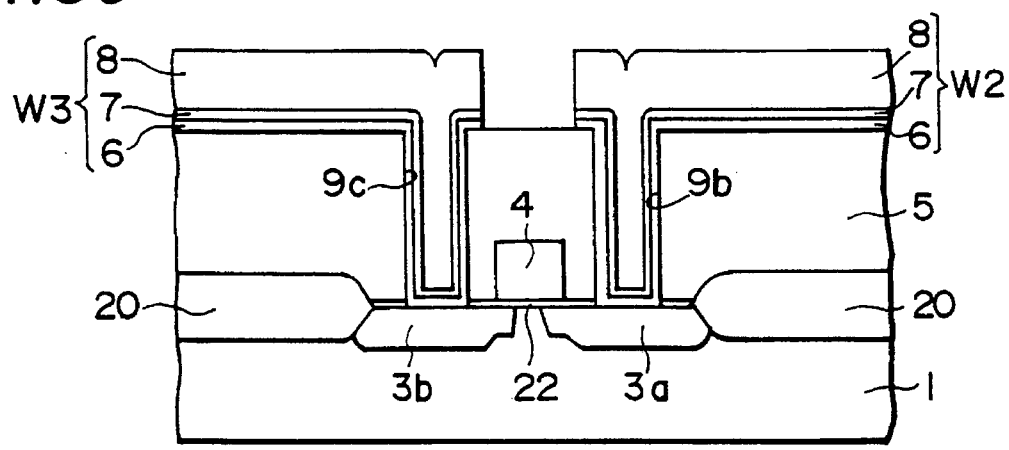
FIG. 13C is a cross-sectional view taken along line C—C of FIG. 13A.

FIG. 13A is a schematic plan view showing one example of MOSFET to which this invention is applied. FIG. 13B is a schematic cross-sectional view taken along line B—B of FIG. 13A. FIG. 13C is a schematic cross-sectional view taken along line C—C of FIG. 13A. In FIG. 13A, the second insulating layer is not shown.

In this MOSFET, an element isolation insulating layer 20 of 200 to 800 nm thickness and a gate insulating layer 22 of 3 to 100 nm thickness are formed on a silicon substrate 1. On the surface of the gate insulating layer 22, a wiring layer 4 defining a gate electrode is formed, with one end lying over the element isolation insulating layer 20. The wiring layer 4 has on opposite sides source/drain diffusion regions 3a, 3b. On the surface of the areas including the source/drain diffusion regions 3a, 3b and the element isolation insulating layer 20, an insulating layer 5 (second insulating layer) of 0.2 to 2 μm thickness is formed. In the insulating layer 5, a contact hole 9a is formed at a portion situated on the element isolation insulating layer of the wiring layer 4, and also contact holes 9b, 9c partly communicating with the respective source/drain diffusion regions 3a, 3b are formed. At predetermined areas including the respective contact holes 9a, 9b, 9c, multilayer interconnection layers W1, W2, W3 are formed. Each of the multilayer interconnection layers W1, W2, W3 is composed of a conductive silicon layer 6 as a lower layer, a barrier metal layer 7 as an intermediate layer lying over the conductive silicon layer 6, and a metal wiring layer 8 as an upper layer lying over the barrier metal layer 7. These multilayer interconnection layers W1, W2, W3 may be manufactured by the manufacturing process of the first embodiment.

The kind and concentration of impurities depend on the type, i.e. n-type or p-type, of MOSFET. Regarding the impurities of the source/drain diffusion regions 3a, 3b and the wiring layer 4, a usual technology may be used. For example, in the case of n-type MOSFET, the source/drain diffusion regions 3a, 3b contain phosphorus or arsenic as impurities in a concentration of $1\times10^{19}$ to $1\times10^{21}$ atoms $cm^{-3}$. The wiring layer 4 contains phosphorus or arsenic in a concentration of about $1\times10^{19}$ to $1\times10^{21}$ atoms $cm^{-3}$. The conductive silicon layer 6 constituting the multilayer interconnection layers W1, W2, W3 contains phosphorus or arsenic in a concentration of about $1\times10^{19}$ to $1\times10^{21}$ atoms $cm^{-3}$.

This should by no means be limited to the foregoing embodiments, and various modifications may be suggested within the scope of gist of this invention. For example, this invention may be applied also to the contact structure of a semiconductor device, such as a p-type MOSFET, a CMOS transistor, a bipolar device and TFT.

Further, if the conductive layer 3 and the conductive silicon layer 6 have different doping types, it is possible to provide a p-n diode. This is, as described in connection with the first embodiment, the conductive layer 3 and the conductive silicon layer 6 in the contact hole 9a have a negative doping polarity, while the wiring layer 4 and the conductive silicon layer 6 in the contact hole 9b have a positive doping polarity.

What is claimed is:

1. A semiconductor device comprising:
   (a) a semiconductor substrate;
   (b) a conductive region substantially made of a semiconductor substance;
   (c) an insulating layer covering a surface of said semiconductor substrate at an area including said conductive region;
   (d) a contact hole formed in said insulation layer to electrically connect with said conductive region, said contact hole formed by removing a part of said insulating layer; and
   (e) a multilayer interconnection layer electrically connecting to said conductive region through said contact hole, said multilayer interconnection layer comprising:
      a conductive layer substantially made of polycrystalline silicon formed over said conductive region, said conductive layer formed along an inside wall of said contact hole and having a thickness smaller than a half length of a diameter of said contact hole,
      a refractory metal filling a recess of said contact hole over said conductive layer formed along the inside wall of said contact hole,
      a barrier metal layer formed over said refractory metal filling the recess of said contact hole, and
      a metal wiring layer made chiefly of aluminum formed over said barrier metal layer.

2. A semiconductor device comprising:
   (a) a semiconductor substrate;
   (b) a conductive region substantially made of a semiconductor substance;
   (c) an insulating layer covering a surface of said semiconductor substrate at an area including said conductive region;
   (d) a contact hole formed in said insulation layer to electrically connect with said conductive region, said contact hole formed by removing a part of said insulating layer; and
   (e) a multilayer interconnection layer electrically connecting to said conductive region through said contact hole, said multilayer interconnection layer comprising:
      a conductive layer substantially made of polycrystalline silicon formed over said conductive region,
      a barrier metal layer formed over said conductive layer, wherein said conductive layer has a thickness smaller than a half length of a diameter of said contact hole, said conductive layer and said barrier metal layer formed along an inside wall of said contact hole,
      a refractory metal filling a recess of said contact hole over said conductive layer and said barrier metal layer formed along the inside wall of said contact hole, and
      a metal wiring layer made chiefly of aluminum formed over said refractory metal filling the recess of said contact hole.

3. A semiconductor device comprising:
   (a) a semiconductor substrate;
   (b) a conductive region substantially made of a semiconductor substance;
   (c) an insulating layer covering a surface of said semiconductor substrate at an area including said conductive region;
   (d) a contact hole formed in said insulating layer to electrically connect with said conductive region, said contact hole formed by removing a part of said insulating layer; and
   (e) a multilayer interconnection layer formed over a top surface of said insulating layer and electrically connecting to said conductive region through said contact hole, said multilayer interconnection layer comprising:
      a conductive layer substantially made of polycrystalline silicon formed over said conductive region and said top surface of said insulating layer, said conductive layer having a thickness of at least a half length of a diameter of said contact hole, said thickness measured from said top surface of said insulating layer to a barrier metal layer, said conductive layer filling said contact hole,
      said barrier metal layer formed over said conductive layer filling said contact hole, and
      a metal wiring layer formed over said barrier metal layer.

4. A semiconductor device comprising:
   (a) a semiconductor substrate;

(b) a plurality of first conductive layers having impurities doped in a silicon material comprising said semiconductor substrate;

(c) a wiring layer formed over a first insulating layer, said wiring layer substantially made of silicon;

(d) a second insulating layer covering a surface of said semiconductor substrate at an area including said first conductive layers and said wiring layer;

(e) contact holes formed in said second insulating layer to electrically connect with said first conductive layers and said wiring layer respectively, said contact holes formed by removing a part of said second insulating layer; and (f) a multilayer interconnection layer electrically connecting to at least one of said first conductive layers and said wiring layer through said contact holes, said multilayer interconnection layer comprising:

a second conductive layer substantially made of a polycrystalline silicon and formed over said one of said first conductive layers and said wiring layer, said second conductive layer formed along an inside wall of each said contact hole and having a thickness smaller than a half length of a diameter of each said contact hole, a refractory metal filling a recess of each said contact hole over said second conductive layer formed along the inside wall of each said contact hole, a barrier metal layer formed over said refractory metal filling the recess of each said contact hole, and a metal wiring layer made chiefly of aluminum formed over said barrier metal layer.

5. A semiconductor device comprising:

(a) a semiconductor substrate;

(b) a plurality of first conductive layers having impurities doped in a silicon material comprising said semiconductor substrate;

(c) a wiring layer formed over a first insulating layer, said wiring layer substantially made of silicon;

(d) a second insulating layer covering a surface of said semiconductor substrate at an area including said first conductive layers and said wiring layer;

(e) contact holes formed in said second insulating layer to electrically connect with said first conductive layers and said wiring layer respectively, said contact holes formed by removing a part of said second insulating layer; and (f) a multilayer interconnection layer electrically connecting to at least one of said first conductive layers and said wiring layer through said contact holes, said multilayer interconnection layer comprising:

a second conductive layer substantially made of a polycrystalline silicon and formed over said one of said first conductive layers and said wiring layer, said second conductive layer having a thickness smaller than a half length of a diameter of each said contact hole, a barrier metal layer formed over said second conductive layer, said second conductive layer and said barrier metal layer formed along an inside wall of each said contact hole, a refractory metal filling a recess of each said contact hole over said second conductive layer and said barrier metal layer formed along the inside wall of each said contact hole, and a metal wiring layer made chiefly of aluminum formed over said refractory metal filling the recess of each said contact hole.

6. A semiconductor device comprising:

(a) a semiconductor substrate;

(b) a plurality of first conductive layers having impurities doped in a silicon material comprising said semiconductor substrate;

(c) a wiring layer formed over a first insulating layer, said wiring layer substantially made of silicon;

(d) a second insulating layer covering a surface of said semiconductor substrate at an area including said first conductive layers and said wiring layer;

(e) contact holes formed in said second insulating layer to electrically connect with said first conductive layers and said wiring layer respectively, said contact holes formed by removing a part of said second insulating layer; and (f) a multilayer interconnection layer formed over a top surface of said second insulating layer and electrically connecting to at least one of said first conductive layers and said wiring layer through said contact holes, said multilayer interconnection layer comprising:

a second conductive layer substantially made of a polycrystalline silicon and formed over said one of said first conductive layers, said wiring layer and said top surface of said second insulating layer, said second conductive layer having a thickness of at least a half length of a diameter of each said contact hole, said thickness measured from said top surface of said second insulating layer to a barrier metal layer, said second conductive layer filling a recess of each said contact hole, said barrier metal layer formed over said second conductive layer filling the recess of each said contact hole, and a metal wiring layer formed over said barrier metal layer.

7. A semiconductor device comprising:

(a) a semiconductor substrate;

(b) a plurality of first conductive layers having impurities doped in a silicon material comprising said semiconductor substrate;

(c) an insulating layer covering a surface of said semiconductor substrate including said first conductive layers;

(d) contact holes formed in said insulating layer to electrically connect respectively with said first conductive layers, said contact holes formed by removing parts of said insulating layer; and (e) a multilayer interconnection layer electrically connecting to said first conductive layers through said contact holes, said multilayer interconnection layer comprising:

a second conductive layer made substantially of a polycrystalline silicon and formed over said first conductive layers, said second conductive layer formed along an inside wall of each said contact hole and having a thickness smaller than a half length of a diameter of each said contact hole, a refractory metal filling a recess of each said contact hole over said second conductive layer formed along the inside wall of each said contact hole, a barrier metal layer formed over said refractory metal filling the recess of each said contact hole, and a metal wiring layer made chiefly of aluminum formed over said barrier metal layer.

8. A semiconductor device comprising:

(a) a semiconductor substrate;

(b) a plurality of first conductive layers having impurities doped in a silicon material comprising said semiconductor substrate;

(c) an insulating layer covering a surface of said semiconductor substrate including said first conductive layers;

(d) contact holes formed in said insulating layer to electrically connect respectively with said conductive layers, said contact holes formed by removing parts of said insulating layer; and (e) a multilayer interconnection layer electrically connecting to said conductive layers through said contact holes, said multilayer interconnection layer comprising:

a second conductive layer made substantially of a polycrystalline silicon and formed over said first conductive layers, said second conductive layer having a thickness smaller than a half length of a diameter of each said contact hole, a barrier metal layer formed over said second conductive layer, said second conductive layer and said barrier metal layer formed along an inside wall of each said contact hole, a refractory metal filling a recess of each said contact hole over said second conductive layer and said barrier metal formed along the inside wall of each said contact hole, and a metal wiring layer made chiefly of aluminum formed over said refractory metal filling the recess of each said contact hole.

9. A semiconductor device comprising:

(a) a semiconductor substrate;

(b) a plurality of first conductive layers having impurities doped in a silicon material comprising said semiconductor substrate;

(c) an insulating layer covering a surface of said semiconductor substrate including said first conductive layers;

(d) contact holes formed in said insulating layer to electrically connect respectively with said first conductive layers, said contact holes formed by removing parts of said insulating layer; and (e) a multilayer interconnection layer formed over a top surface of said insulating layer and electrically connecting to said first conductive layers through said contact holes, said multilayer interconnection layer comprising:

a second conductive layer made substantially of a polycrystalline silicon and formed over said first conductive layers and said top surface of said insulating layer, said second conductive layer having a thickness of at least a half length of a diameter of each said contact hole, said thickness measured from said top surface of said insulating layer to a barrier metal layer, said second conductive layer filling each said contact hole, said barrier metal layer formed over said second conductive layer, and a metal wiring layer formed over said barrier metal layer.

10. A semiconductor device comprising:

(a) a semiconductor substrate;

(b) a conductive region substantially made of a semiconductor substance;

(c) an insulating layer covering a surface of said semiconductor substrate at an area including said conductive region;

(d) a contact hole formed in said insulating layer to electrically connect with said conductive region, said contact hole formed by removing a part of said insulating layer; and (e) a multilayer interconnection layer electrically connecting to said conductive region through said contact hole, said multilayer interconnection layer comprising:

a conductive layer substantially made of polycrystalline silicon formed over said conductive region, said conductive layer having a thickness smaller than a half length of a diameter of said contact hole, a barrier metal layer formed over said conductive layer, said conductive layer and said barrier metal layer formed along an inside wall of said contact hole, and a metal wiring layer made chiefly of aluminum formed over said barrier metal layer, said metal wiring layer filling a recess of said contact hole over said conductive layer and said barrier layer formed along the inside wall of the contact hole.

11. A semiconductor device comprising:

(a) a semiconductor substrate;

(b) a plurality of first conductive layers having impurities doped in a silicon material comprising said semiconductor substrate;

(c) a wiring layer formed over a first insulating layer, said wiring layer substantially made of silicon;

(d) a second insulating layer covering a surface of said semiconductor substrate at an area including said first conductive layers and said wiring layer;

(e) contact holes formed in said second insulating layer to electrically connect with said first conductive layers and said wiring layer respectively, said contact holes formed by removing a part of said second insulating layer; and (f) a multilayer interconnection layer electrically connecting to at least one of said first conductive layers and said wiring layer through said contact holes, said multilayer interconnection layer comprising:

a second conductive layer substantially made of a polycrystalline silicon and formed over said one of said first conductive layers and said wiring layer, said second conductive layer having a thickness smaller than a half length of a diameter of each said contact hole, a barrier metal layer formed over said second conductive layer, said second conductive layer and said barrier metal layer formed along an inside wall of each said contact hole, and a metal wiring layer made chiefly of aluminum formed over said barrier metal layer, said metal wiring layer filling a recess of each said contact hole over said second conductive layer and said barrier metal layer formed along the inside wall of each contact hole.

12. A semiconductor device comprising:

(a) a semiconductor substrate;

(b) a plurality of first conductive layers having impurities doped in a silicon material comprising said semiconductor substrate;

(c) an insulating layer covering a surface of said semiconductor substrate including said first conductive layers;

(d) contact holes formed in said insulating layer to electrically connect respectively with said first conductive layers, said contact holes formed by removing parts of said insulating layer; and (e) a multilayer interconnection layer electrically connecting to said first conductive layers through said contact holes, said multilayer interconnection layer comprising:

a second conductive layer made substantially of a polycrystalline silicon and formed over said first conductive layers, said second conductive layer having a thickness smaller than a half length of a diameter of each said contact hole, a barrier metal layer formed over said second conductive layer, said second conductive layer and said barrier metal layer formed along an inside wall of each said contact hole, and a metal wiring layer made chiefly of aluminum formed over said barrier metal layer, said metal wiring layer filling a recess of each said contact hole over said second conductive layer and said barrier metal formed along the inside wall of each said contact hole.

\* \* \* \* \*